United States Patent
Miyamoto

(10) Patent No.: US 11,676,837 B2
(45) Date of Patent: Jun. 13, 2023

(54) SUBSTRATE HOLDER

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 16/401,841

(22) Filed: May 2, 2019

(65) Prior Publication Data
US 2020/0006090 A1  Jan. 2, 2020

(30) Foreign Application Priority Data

Jun. 27, 2018  (JP) .............................. JP2018-122083

(51) Int. Cl.
C25D 17/06 (2006.01)
C25D 17/00 (2006.01)
H01L 21/673 (2006.01)
H01L 21/687 (2006.01)

(52) U.S. Cl.
CPC .......... *H01L 21/673* (2013.01); *C25D 17/001* (2013.01); *C25D 17/06* (2013.01); *H01L 21/68721* (2013.01); *H01L 21/68785* (2013.01)

(58) Field of Classification Search
CPC ......... H01L 21/68721; H01L 21/68728; H01L 21/67323; H01L 21/673; H01L 21/68785; C25D 17/06; C25D 17/004; C25D 17/001; C25D 17/08
See application file for complete search history.

(56) References Cited

U.S. PATENT DOCUMENTS

| 4,325,526 A * | 4/1982 | Kitagawa | F16L 3/23 24/336 |
| 5,135,636 A * | 8/1992 | Yee | C25D 17/08 204/DIG. 7 |
| 5,527,024 A * | 6/1996 | Dyskstra | B25B 5/12 269/228 |
| 5,747,773 A * | 5/1998 | Griffin | B23K 9/1006 219/130.1 |
| 5,775,000 A * | 7/1998 | Maekawa | H01L 21/68728 134/902 |
| 5,843,296 A * | 12/1998 | Greenspan | C25D 1/10 205/68 |
| 6,660,139 B1 * | 12/2003 | Sendai | H01L 21/2885 118/428 |
| 7,727,366 B2 * | 6/2010 | Keigler | C25D 21/12 204/297.06 |
| 9,222,192 B2 * | 12/2015 | Rauenbusch | C25D 17/001 |
| 9,677,189 B2 * | 6/2017 | Minami | C25D 7/12 |

(Continued)

FOREIGN PATENT DOCUMENTS

JP  2018-040045 A  3/2018
KR  20090109851 A  * 10/2009 ............. C25D 17/06

Primary Examiner — Alexander W Keeling
Assistant Examiner — Mofoluwaso S Jebutu
(74) Attorney, Agent, or Firm — Weihrouch IP

(57) ABSTRACT

One object of this application is to provide an advanced substrate holder including a clamper. A substrate holder holds a substrate by interposing the substrate between frames. The substrate holder includes a front frame, a rear frame, and one or a plurality of clampers. Each of the clampers includes a hook portion including a hook base and a hook main body, and a plate including at least one claw. At least one of the clampers includes the plate including a first claw for a lock and a second claw for a semi-lock.

11 Claims, 14 Drawing Sheets

(56) References Cited

U.S. PATENT DOCUMENTS

| | | | |
|---|---|---|---|
| 10,174,437 B2* | 1/2019 | Harris | C25D 17/004 |
| 2002/0157960 A1* | 10/2002 | Dordi | H01L 21/68721 |
| | | | 205/148 |
| 2003/0019744 A1* | 1/2003 | Pokorny | H01L 21/68785 |
| | | | 204/297.01 |
| 2003/0052319 A1* | 3/2003 | Chen | H01L 21/67092 |
| | | | 257/48 |
| 2014/0345805 A1* | 11/2014 | Maeda | H01L 21/67103 |
| | | | 156/538 |

* cited by examiner

US 11,676,837 B2

SUBSTRATE HOLDER

CROSS-REFERENCE TO RELATED APPLICATION

This application is based upon and claims the benefit of priority of the prior Japanese Patent Application No. 2018-122083, filed on Jun. 27, 2018, the entire content of which is incorporated herein by reference.

TECHNICAL FIELD

The present invention relates to a substrate holder.

BACKGROUND

Conventionally, wiring, bumps (protruding electrodes), and the like have been formed on a surface of a substrate such as a semiconductor wafer and a printed substrate. As a method for forming such wiring, bumps, and the like, an electroplating method has been known.

PTL 1 (Japanese Unexamined Patent Application Publication No. 2018-40045) discloses a substrate holder including clampers. PTL 1 discloses that this substrate holder can reduce or prevent occurrence of deflection even when holding a large-sized thin substrate.

CITATION LIST

Patent Literature

PTL 1: Japanese Unexamined Patent Application Publication No. 2018-40045

SUMMARY

One object of this application is to provide an advanced substrate holder including a clamper.

This application discloses a substrate holder for holding a substrate by interposing the substrate between frames as one embodiment. The substrate holder includes a front frame, a rear frame, and one or a plurality of clampers that clamp the front frame and the rear frame. One or a plurality of the clampers each include a hook portion and a plate. The hook portion is mounted on one of the front frame and the rear frame. The hook portion includes a hook base and a hook main body. The hook main body is pivotably mounted on the hook base. The plate is mounted on another of the front frame and the rear frame. The plate includes at least one claw configured such that the hook main body is hooked on the claw with a pivotal movement of the hook main body. At least one of one or a plurality of the clampers include the plate including a first claw and a second claw. The first claw is configured to allow the substrate holder to hold a substrate such that the hook main body is hooked on the first claw. The second claw is configured such that a distance between the front frame and the rear frame when the hook main body is hooked on the second claw is larger than a distance between the front frame and the rear frame when the hook main body is hooked on the first claw.

DETAILED DESCRIPTION

<Outline of Plating Device>

Figure 1:
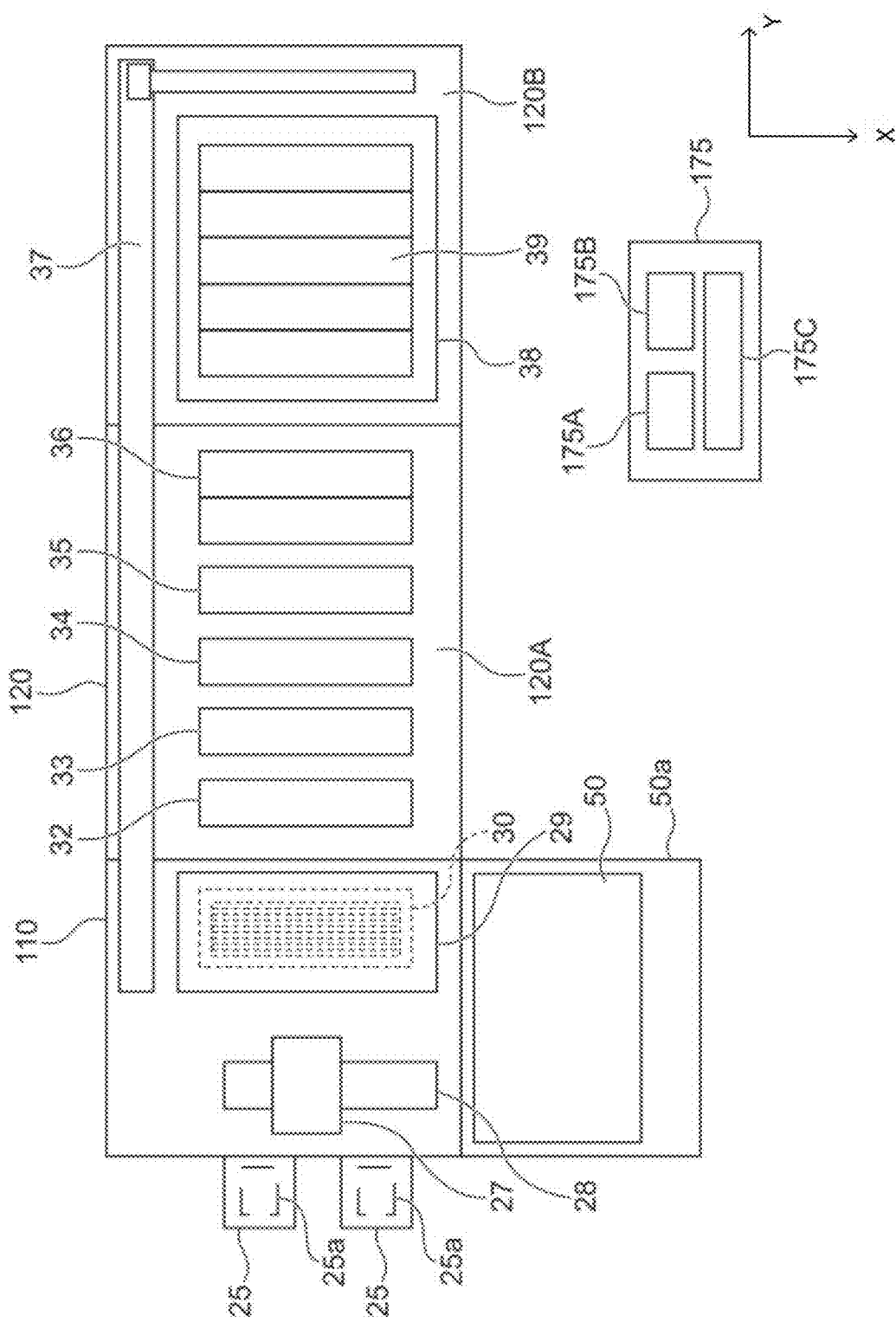
FIG. 1 is an entire layout drawing of a plating device according to one embodiment.

FIG. 1 is an entire layout drawing of a plating device for which a substrate holder according to one embodiment of the present invention is used. As illustrated in FIG. 1, this plating device 100 is roughly divided into a loading/unloading unit 110, which loads a substrate (equivalent to an exemplary processed product) to a substrate holder 1 (refer to the drawings from FIGS. 2A to 2C for the reference numeral "1") or unloads the substrate from the substrate holder 1, a processing unit 120, which processes the substrate, and a cleaning unit 50a. The processing unit 120 further includes a preprocessing/postprocessing unit 120A, which performs preprocessing and postprocessing on the substrate, and a plating processing unit 120B, which performs a plating process on the substrate. The substrate processed by this plating device 100 includes a square substrate and a circular substrate. The square substrate includes any polygonal plated object including a glass substrate, a liquid crystal substrate, and a printed substrate having polygonal shapes such as rectangular shapes. The circular substrate includes any circular plated object including a semiconductor wafer and a glass substrate.

The loading/unloading unit 110 includes two cassette tables 25 and a substrate removal/mounting mechanism 29. The cassette table 25 includes a cassette 25a that houses a substrate such as a semiconductor wafer, a glass substrate, a liquid crystal substrate, and a printed substrate. The substrate removal/mounting mechanism 29 is configured to mount/remove the substrate on/from the substrate holder 1. A stocker 30 to house the substrate holder 1 is disposed at the proximity of (for example, under) the substrate removal/mounting mechanism 29. In the center of these units 25, 29, and 30, a substrate conveying device 27 formed of a robot for conveyance that conveys the substrate between these units is arranged. The substrate conveying device 27 is configured to run with a running mechanism 28.

The cleaning unit 50a includes a cleaning device 50 that cleans and dries the substrate after the plating process. The substrate conveying device 27 is configured to convey the substrate after the plating process to the cleaning device 50 and take out the cleaned substrate from the cleaning device 50.

The preprocessing/postprocessing unit 120A includes a pre-wet tank 32, a pre-soak tank 33, a pre-rinse tank 34, a blow tank 35, and a rinse tank 36. In the pre-wet tank 32, the substrate is immersed in a pure water. In the pre-soak tank 33, an oxide film on a surface of a conducting layer such as a seed layer formed on a surface of the substrate is removed by etching. In the pre-rinse tank 34, the substrate after pre-soak is cleaned with a cleaning liquid (for example, pure water) together with the substrate holder. In the blow tank 35, liquid draining of the substrate after cleaning is performed. In the rinse tank 36, the substrate after plating is cleaned with the cleaning liquid together with the substrate holder. The pre-wet tank 32, the pre-soak tank 33, the pre-rinse tank 34, the blow tank 35, and the rinse tank 36 are arranged in this order. This configuration of the preprocessing/postprocessing unit 120A in the plating device 100 is one example. The configuration of the preprocessing/postprocessing unit 120A in the plating device 100 is not limited, and can employ another configuration.

The plating processing unit 120B includes a plurality of plating tanks 39 including an overflow tank 38. Each plating tank 39 internally houses one substrate and immerses the substrate in a plating solution internally held to perform plating such as copper plating on the substrate surface. Here, a type of the plating solution is not especially limited, and various plating solutions are used as usage.

The plating device 100 includes a substrate holder conveyance device 37 positioned lateral to these respective devices. The substrate holder conveyance device 37 employs, for example, a linear motor system to convey the substrate holder between these respective devices together with the substrate. This substrate holder conveyance device 37 is configured to convey the substrate holder between the substrate removal/mounting mechanism 29, the pre-wet tank 32, the pre-soak tank 33, the pre-rinse tank 34, the blow tank 35, the rinse tank 36, and the plating tank 39.

A plating process system including a plurality of plating devices 100 configured as described above includes a controller 175 configured to control the above-described respective units. The controller 175 includes a memory 175B that stores a predetermined program, a Central Processing Unit (CPU) 175A that executes the program in the memory 175B, and a control unit 175C achieved such that the CPU 175A executes the program. The control unit 175C is configured to perform, for example, conveyance control of the substrate conveying device 27, mounting/removing control on/from the substrate holder of the substrate in the substrate removal/mounting mechanism 29, conveyance control of the substrate holder conveyance device 37, control of a plating current and a plating time in each plating tank 39, and control of an opening diameter of an anode mask (not illustrated) and an opening diameter of a regulation plate (not illustrated) arranged in each plating tank 39. The controller 175 is configured communicable with an upper controller (not illustrated) that overall controls the plating device 100 and its related apparatus, thus ensuring data exchange with a database included in the upper controller.

Here, a storage medium that constitutes the memory 175B stores various kinds of setting data and various programs such as a plating processing program, which is described later. As the storage medium, known one such as a memory such as a computer-readable ROM or RAM, and a disk-shaped storage medium such as a hard disk, a CD-ROM, a DVD-ROM, or a flexible disk can be used.

<Substrate Holder 1>

Figure 2A:
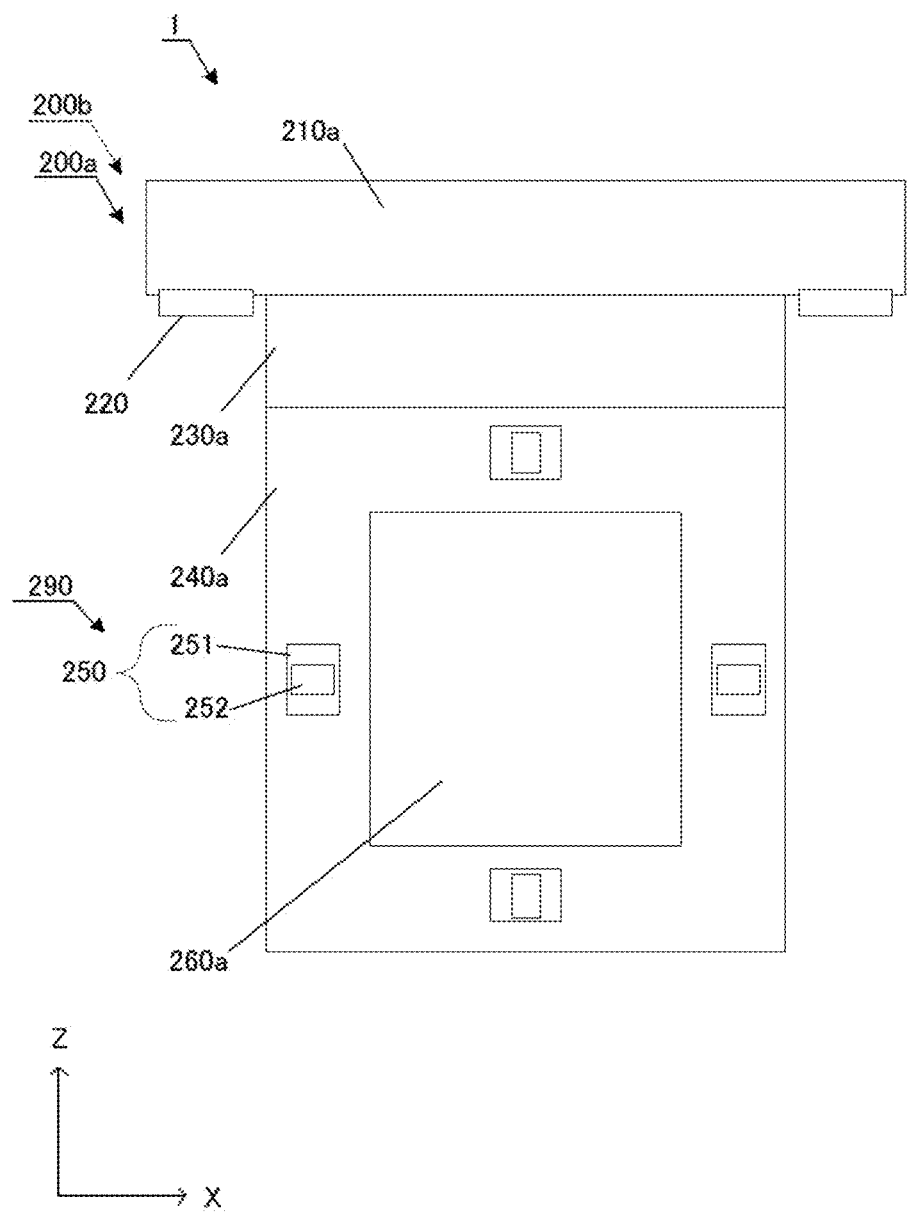
FIG. 2A is a front view schematically illustrating a substrate holder according to the one embodiment.
Figure 2B:
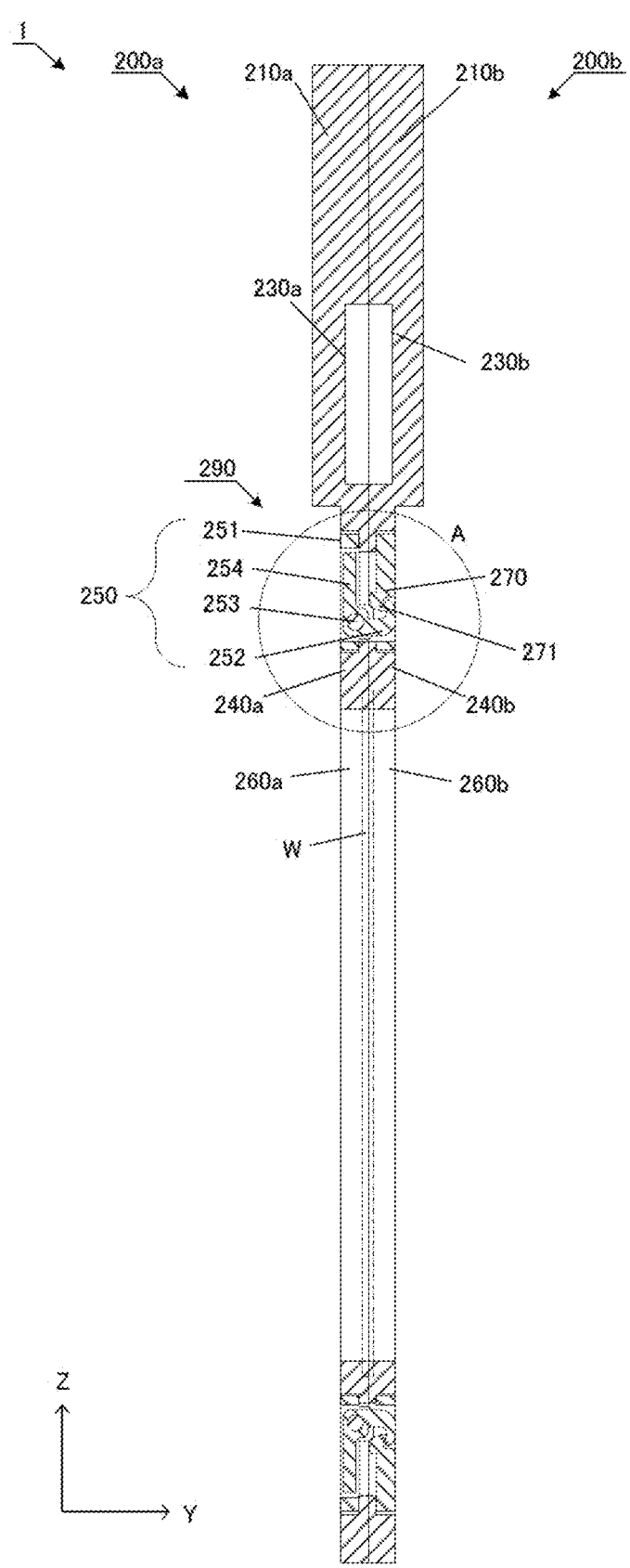
FIG. 2B is a cross-sectional side view schematically illustrating the substrate holder according to the one embodiment.
Figure 2C:
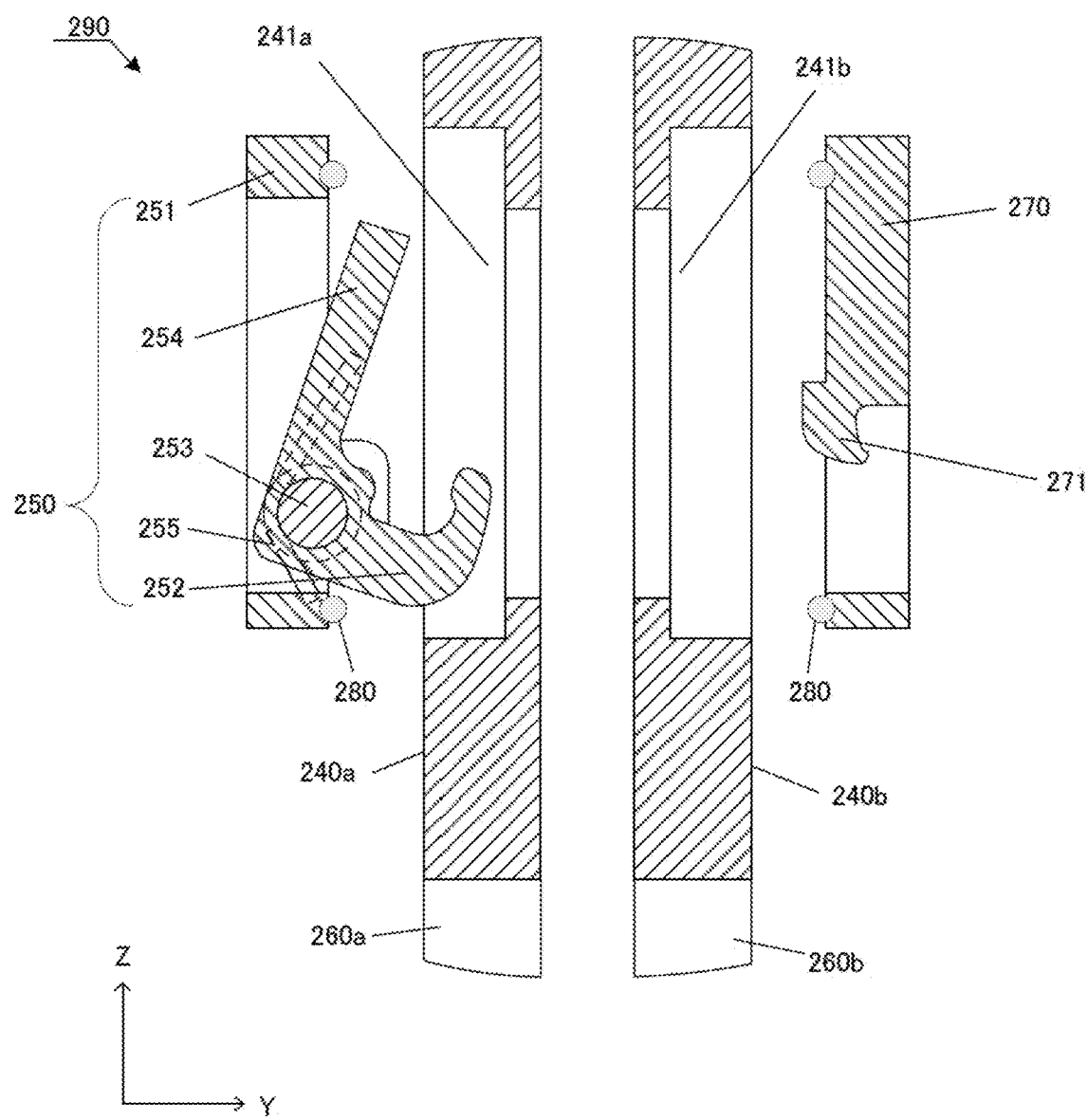
FIG. 2C is an enlarged view of a part "A" in FIG. 2B.

The following describes the substrate holder 1 according to the one embodiment using FIGS. 2A to 2C. FIG. 2A is a front view schematically illustrating the substrate holder 1 according to the one embodiment. FIG. 2B is a cross-sectional side view schematically illustrating the substrate holder 1 according to the one embodiment. FIG. 2C is an enlarged view of a part "A" in FIG. 2B. However, FIG. 2C is an exploded view. In the following, a description will be given assuming that a right-left direction (a longitudinal direction of an arm portion 210a, which is described later) in FIG. 2A is set to an X direction, a direction perpendicular to the paper surface (a direction perpendicular to a surface of a substrate W that should be held) is set to a Y direction, and an up-down direction is set to a Z direction. For the X direction, a right side direction in FIG. 2A is set to the positive direction. For the Y direction, a back side direction with respect to the paper surface of FIG. 2A is set to the positive direction. For the Z direction, the up direction in FIG. 2A is set to the positive direction.

The substrate holder 1 is a member that interposes the substrate between frames to hold the substrate. The substrate holder 1 includes a front frame 200a and a rear frame 200b. More specifically, at least a part of the substrate holder 1 is configured such that the front frame 200a and the rear frame 200b are combined. The front frame 200a and the rear frame 200b are clamped with at least one, preferably a plurality of clampers 290 (the detail of the clamper 290 will be described later). A dotted line extending from the reference numeral "200b" in FIG. 2A indicates that the rear frame 200b is not illustrated in FIG. 2A. The substrate holder 1 is configured such that the substrate W is interposed and held between the front frame 200a and the rear frame 200b. The substrate W is illustrated with an imaginary line in FIG. 2B.

The front frame 200a and the rear frame 200b have symmetrical structures excluding a hook portion 250 and a plate 270, which are described later. Accordingly, the names "front" and "rear" are merely expediencies. In other words, any of a side on which the front frame 200a is positioned and a side on which the rear frame 200b is positioned may be treated as a front side. However, it is not necessary to design the front frame 200a and the rear frame 200b in a symmetrical structure.

The arm portion 210a is disposed on top of the front frame 200a. A shoulder-part electrode 220 may be disposed on a shoulder part of the arm portion 210a. In the example in FIGS. 2A to 2C, two shoulder-part electrodes 220 are disposed on both shoulders of the arm portion 210a. In FIG. 2A, the reference numeral is representatively attached to only one shoulder-part electrode 220. The shoulder-part electrode 220 is electrically connected to a substrate electrode, which is described later, with a conductive path (for example, wiring or a busbar) (not illustrated). The substrate electrode, which is described later, is electrically connected to the substrate W. Thus, the shoulder-part electrode 220 is electrically connected to the substrate W. The plating device 100 supplies the substrate W with electric power required for a plating process via the shoulder-part electrode 220. Here, "supply electric power" may be rephrased as "apply a voltage" or "apply a current." An arm portion 210b is disposed on the rear frame 200b. The arm portion 210b has a configuration equivalent to that of the arm portion 210a.

The front frame 200a includes a wiring storage 230a. The wiring storage 230a is disposed between the arm portion 210a and a frame body 240a, which is described later. The wiring storage 230a is configured to have a space to store the wiring that electrically connects the shoulder-part electrode 220 to the substrate W. When the shoulder-part electrode 220 is electrically connected to the substrate W with the busbar, the front frame 200a need not include the wiring storage 230a. A wiring storage 230b is disposed on the rear frame 200b. The wiring storage 230b has a configuration equivalent to that of the wiring storage 230a.

The front frame 200a further includes the frame body 240a. The rear frame 200b further includes a frame body 240b. The frame body 240a and the frame body 240b are approximately plate-shaped members. The frame body 240a and the frame body 240b have respective central portions on which respective opening 260a and opening 260b for exposing the substrate W that should be held are formed. The opening 260a and the opening 260b preferably have shapes corresponding to shapes of regions that should be plated in the substrate W. For example, when the substrate W is square, the regions that should be plated are also generally square. Accordingly, in the example in FIGS. 2A to 2C, the opening 260a and the opening 260b are square. The frame body 240a and the frame body 240b hold the substrate W in cooperation such that the substrate W is interposed between the frame body 240a and the frame body 240b. The detail of a part that holds the substrate W will be described later using FIG. 3.

One surface of the held substrate W is exposed outside via the opening 260a provided on the frame body 240a. Another surface of the held substrate W is exposed outside via the opening 260b provided on the frame body 240b. Accordingly, when the substrate holder 1 is immersed in the plating solution, both the surfaces of the substrate W will contact the plating solution. In other words, use of the substrate holder 1 in FIGS. 2A to 2C allows both the surfaces of the substrate W to be plated. The substrate holder 1 in FIGS. 2A to 2C can be used for plating one surface such that an electrical condition and the like inside the substrate holder 1 are adjusted. The substrate holder 1 may be configured to have only either the opening 260a or the opening 260b (in this case, the substrate holder 1 will be a holder for one-surface plating).

The substrate holder 1 includes one or a plurality of clampers 290 to clamp the front frame 200a and the rear frame 200b. The clamper 290 includes the hook portion 250 mounted on the front frame 200a, more specifically, the frame body 240a, and the plate 270 mounted on the rear frame 200b, more specifically, the frame body 240b. In the example in FIGS. 2A to 2C, the clampers 290 are disposed near the opening 260a. More specifically, in the example in FIGS. 2A to 2C, the clampers 290 are disposed near the centers of respective sides of the square opening 260a. Accordingly, in the example in FIGS. 2A to 2C, total four clampers 290 are disposed. In FIG. 2A and FIG. 2B, the reference numeral is representatively attached to only one clamper 290.

The hook portion 250 includes a hook base 251 mounted on the frame body 240a, a hook main body 252, and a shaft 253 that supports the hook main body 252 pivotably with respect to the hook base 251. The hook portion 250 may further include a lever 254 to pivotally move the hook main body 252 centering on the shaft 253. The hook main body 252 is extending toward the back side of the substrate holder 1, that is, a direction to the rear frame 200b. The shaft 253 is extending in a plane parallel to the surface of the substrate that should be held. A specific direction of a longitudinal direction of the shaft 253 in the plane parallel to the surface of the substrate that should be held may be different depending on the clamper 290. At least one of the hook base 251, the hook main body 252, the shaft 253, and the lever 254 may be formed of titanium or titanium alloy.

The hook portion 250 may further include a pressing member 255 that applies force to a direction maintaining hooking on a claw 271, which is described later, of the hook main body 252 (the anticlockwise direction in the hook portion 250 in FIG. 2C). The pressing member 255 can apply force to the hook main body 252 to maintain the hooking of the hook main body 252, thus preventing the hook main body 252 from removing from the claw 271. The pressing member 255 may be, for example, a spring, and more specifically, may be a torsion spring. The torsion spring contributes to a space-saving of the pressing member 255 and other components. Accordingly, employing the torsion spring as the pressing member 255 may contribute to thinning of the thickness of the holder. The reason that the thinning of the holder thickness is preferred will be described below. The pressing member 255 may be a member operated by, for example, electromagnetic means, other than the spring.

A port 241a (see FIG. 2C) is provided on the frame body 240a. The port 241a is provided to mount the hook main body 252. The port 241a is configured to allow at least the hook main body 252 to access at least a part of the plate 270, which is described later, and more specifically, allow the hook main body 252 to access the claw 271 of the plate 270. The hook portion 250 is mounted on the port 241a with, for example, a bolt (see FIG. 10). The substrate holder 1 (especially, the hook portion 250 and the port 241a in the substrate holder 1) is preferably configured such that the hook portion 250 does not project from the frame body 240a, in other words, the hook portion 250 is buried in the frame body 240a, to make the holder thickness as thin as possible. An amount of the plating solution that remains at the substrate holder 1 when the substrate holder 1 is pulled out of the plating solution can be reduced if the hook portion 250 does not project from the frame body 240a. Interference between the hook portion 250 and constituents and the like of the plating tank can be avoided if the hook portion 250 does not project from the frame body 240a.

A port 241b (see FIG. 2C) is provided on the frame body 240b. Positions and the number of the ports 241b correspond to the positions and the number of the ports 241a. The plate 270 is mounted on the port 241b with, for example, a bolt (see FIG. 10). The claw 271, on which the hook main body 252 is hooked with the pivotal movement of the hook main body 252, is disposed on the plate 270. The claw 271 is extending toward the direction to the front frame 200a. The frame body 240a is fixed to the frame body 240b such that the hook main body 252 is hooked on the claw 271. Insofar as the substrate W is appropriately arranged between the frame body 240a and the frame body 240b when the hook main body 252 is hooked on the claw 271, the substrate W will be held by the substrate holder 1. The plate 270 and the port 241b are preferably configured such that the plate 270 does not project from the frame body 240b, in other words, the plate 270 is buried in the frame body 240b, to make the holder thickness as thin as possible. The amount of the plating solution that remains at the substrate holder 1 when the substrate holder 1 is pulled out of the plating solution can be reduced if the plate 270 does not project from the frame body 240*b*. Interference between the plate 270 and the constituents and the like of the plating tank can be avoided if the plate 270 does not project from the frame body 240*b*. The hook main body 252 extending toward the rear frame 200*b* is also preferably configured not to project from the frame body 240*b*.

As described above, in the preferred embodiment, the hook portion 250 and the plate 270 are configured not to project from the respective frames, that is, buried in the respective frames. In this description, this is described as "the clamper 290 is buried in the front frame 200*a* and the rear frame 200*b*."

An elastic supporting member 280 may be disposed between the hook base 251 and the frame body 240*a*. The elastic supporting member 280 is a member to elastically support the hook base 251 and the frame body 240*a* and may be referred to as a "floating member." Note that "floating" is not "electrical floating" here (however, the electrical floating achieved by the elastic supporting member 280 is not excluded). The elastic supporting member 280 in the example in FIGS. 2A to 2C is an O-ring. In FIGS. 2A to 2C, a groove on which the O-ring is mounted is not illustrated. An elastic body such as a spring other than the O-ring can be used as the elastic supporting member 280. The elastic supporting member 280 may be also disposed between the plate 270 and the frame body 240*b*. The detail of the elastic supporting member 280 will be described later (see description about FIG. 10 and FIG. 11).

In the substrate holder to plate the substrate W, at least a part immersed in the plating solution has a thickness that is preferably as thin as possible. Its main reason is the following two points. First, the large thickness of the holder increases a width of the plating tank as a result, thus increasing the size of the apparatus. The increase in size of the apparatus is especially remarkable when the substrate holder is a holder for plating both surfaces. Second, the large thickness of the holder is likely to cause stirring of the plating solution near the substrate W to be insufficient. No protrusion is preferably provided on the part immersed in the plating solution in the substrate holder 1. This is because the protrusion may define the thickness of the substrate holder 1.

In the configuration in FIGS. 2A to 2C, the hook main body 252 is extending toward a side on which the hook portion 250 is not mounted in the front frame 200*a* and the rear frame 200*b*. In the configuration in FIGS. 2A to 2C, the claw 271 is extending toward a side on which the plate 270 is not mounted in the front frame 200*a* and the rear frame 200*b*. Accordingly, the configuration in FIGS. 2A to 2C can zero or at least reduce a length that the hook main body 252, the claw 271, and the like project from the front frame 200*a* and the rear frame 200*b*. In other words, configuring the substrate holder 1 as illustrated in FIGS. 2A to 2C can thin a thickness of the part immersed in the plating solution (the frame body 240*a*, the hook portion 250, the frame body 240*b*, and the plate 270). There is an advantage that the hook portion 250 and the plate 270 in FIGS. 2A to 2C do not project from the frame body 240*a* and the frame body 240*b*, respectively.

In the embodiment illustrated in FIGS. 2A to 2C, the lever 254 is pressed in the direction to the frame body 240*b*, that is, the back-surface direction to remove the hook main body 252 from the claw 271. Instead of this, the lever 254 and the like may be configured such that the lever 254 is pulled to the front-surface side to remove the hook main body 252 from the claw 271. However, the configuration and the control to pull the lever 254 may be more complex than the structure and the control to press the lever 254. Accordingly, as illustrated in FIGS. 2A to 2C, the lever 254 and the like are preferably configured such that the lever 254 is pressed in the back-surface direction to remove the hook main body 252 from the claw 271.

In the embodiment illustrated in FIGS. 2A to 2C, the hook portion 250 is mounted on the front frame 200*a*, and the plate 270 is mounted on the rear frame 200*b*. Alternatively, the hook portion 250 may be mounted on the rear frame 200*b*, and the plate 270 may be mounted on the front frame 200*a*. In other words, a certain hook portion 250 is mounted on one of the front frame 200*a* and the rear frame 200*b*, and a plate 270 corresponding to this hook portion 250 is mounted on the other of the front frame 200*a* and the rear frame 200*b*. Furthermore, in the case of the substrate holder 1 including a plurality of clampers 290, the hook portions 250 may be disposed on both of the front frame 200*a* and the rear frame 200*b*. In this case, the plates 270 are also disposed on both of the front frame 200*a* and the rear frame 200*b* to correspond to arrangement of the hook portions 250. From a perspective of simplicity when the hook main body 252 is pivotally moved, it is preferable that any one of the hook portion 250 and the plate 270 is disposed on the front frame 200*a* and the other one is disposed on the rear frame 200*b*.

<Detail of Part that Holds Substrate W>

Figure 3:
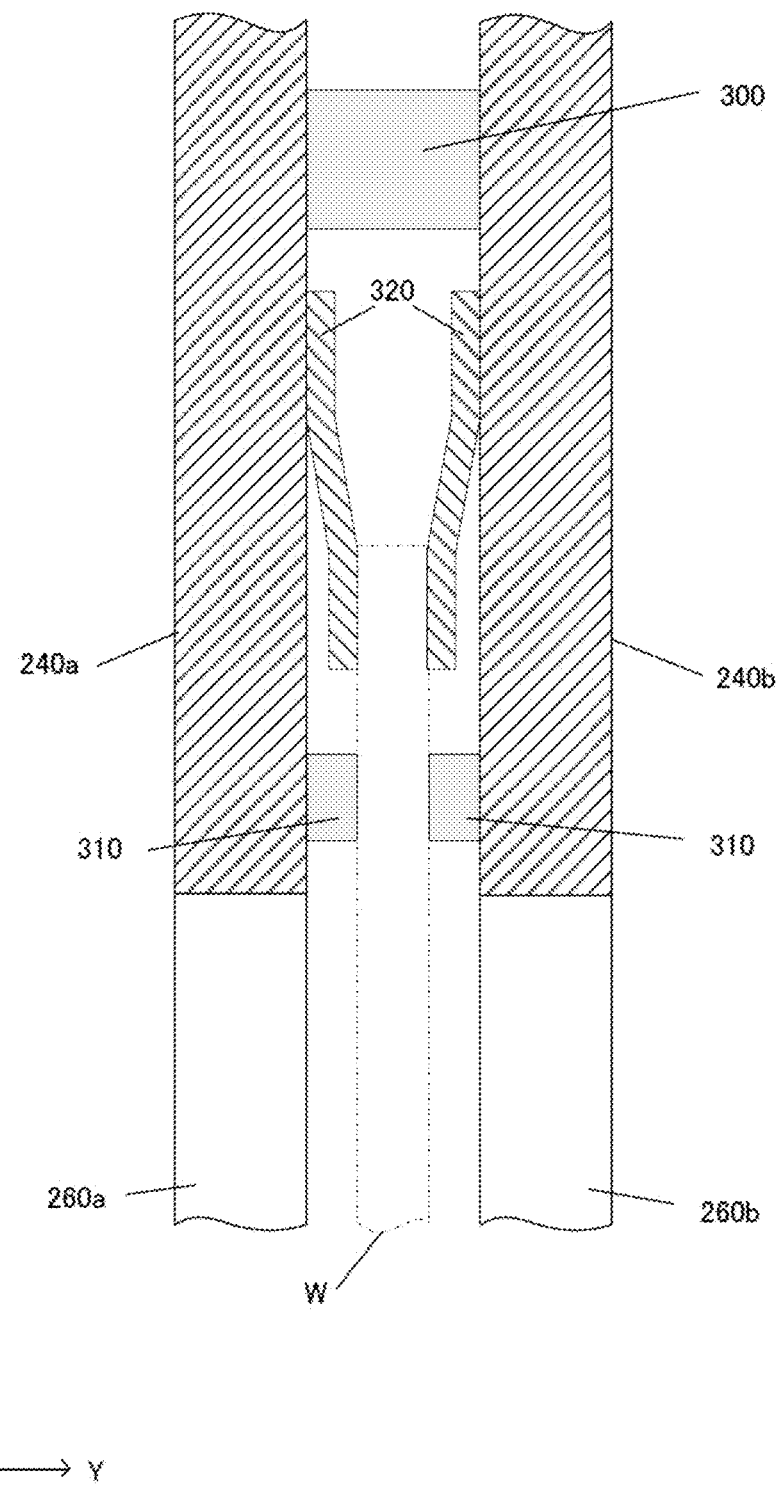
FIG. 3 is a cross-sectional side view of a part that holds a substrate in the substrate holder.

The following describes the detail of the part that holds the substrate W in the substrate holder 1 using FIG. 3. FIG. 3 is a cross-sectional side view of the part that holds the substrate W in the substrate holder 1. The substrate holder 1 is a holder for plating both the surfaces of the substrate W. Thus, the substrate holder 1 needs to supply both the surfaces of the substrate W with electric power. Accordingly, respective substrate electrodes 320 are disposed on the frame body 240*a* and the frame body 240*b* in FIG. 3. The substrate electrode 320 disposed on the frame body 240*a* is electrically connected to a front surface (a surface facing the front) of the substrate W. The substrate electrode 320 disposed on the frame body 240*b* is electrically connected to a back surface of the substrate W. However, a configuration other than the configuration illustrated in FIG. 3 can be employed. An example of another configuration includes a configuration where the substrate electrode 320 is disposed on only any of the frame body 240*a* and the frame body 240*b* and this substrate electrode 320 contacts both the surfaces of the substrate W. The substrate electrode 320 is electrically connected to the shoulder-part electrode 220 with means (not illustrated) such as wiring and a busbar. Accordingly, the electric power supplied to the shoulder-part electrode 220 is supplied to the substrate W via the substrate electrode 320. In this respect, a correspondence relationship between the shoulder-part electrode 220 and the substrate electrode 320 may be configured to supply the front surface and the back surface of the substrate independently with the electric power such that, in the right and left shoulder-part electrodes 220 in FIG. 2A, for example, the left shoulder-part electrode 220 supplies the substrate electrode 320 of the frame body 240*a* corresponding to the front surface of the substrate W with the electric power, and the right shoulder-part electrode 220 supplies the substrate electrode 320 of the frame body 240*b* corresponding to the back surface of the substrate W with the electric power.

As described above, the electric power is supplied to the substrate electrode 320. Accordingly, the substrate holder 1 need to be configured so that the substrate electrode 320 does not touch the plating solution even when the substrate holder 1 is immersed in the plating solution. Therefore, the substrate holder 1 includes an outer seal 300 and an inner seal 310 to seal a space where the substrate electrode 320 exists. The inner seal 310 may be mentioned as a "first sealing member." The outer seal 300 may be mentioned as a "second sealing member." The outer seal 300 is configured to seal a gap between the frame body 240*a* and the frame body 240*b* outside the substrate W. The outer seal 300 may be disposed on the frame body 240*a*, or may be disposed on the frame body 240*b*. In other words, the substrate holder 1 may include the outer seal 300 configured to be mounted on one of the front frame 200*a* and the rear frame 200*b* to contact the other of the front frame 200*a* and the rear frame 200*b*. Meanwhile, the inner seals 310 are disposed on the respective frame body 240*a* and frame body 240*b*. The inner seal 310 contacts the substrate W when the substrate W is held. That is, the inner seal 310 disposed on the frame body 240*a* is configured to seal a gap between the frame body 240*a* and the substrate W. The inner seal 310 disposed on the frame body 240*b* is configured to seal a gap between the frame body 240*b* and the substrate W. The outer seal 300 and the inner seal 310 are deformable elastically in the thickness direction of the substrate W (a direction perpendicular to the surface of the substrate W). The substrate W is held between the frame body 240*a* and the frame body 240*b* with a contact pressure between the inner seals 310 and the substrate W. Note that FIG. 3 is merely a schematic diagram and may be different from an actual configuration. For example, the outer seal 300 and the inner seal 310 may be held with respective seal holders. For example, the inner seal 310 may be disposed on any one of the front frame 200*a* or the rear frame 200*b*.

<Sleeve>

Figure 4:
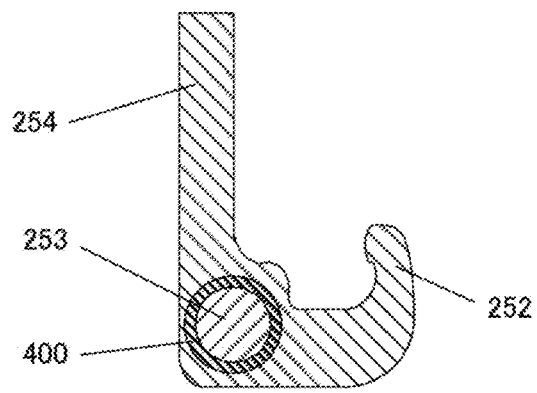
FIG. 4 is a cross-sectional side view illustrating a part of a hook portion.

As aforementioned, the hook main body 252 is configured to pivotally move centering on the shaft 253. Here, when the hook main body 252 directly contacts the shaft 253, a resistance with sliding between the hook main body 252 and the shaft 253 is large. When the sliding resistance between the hook main body 252 and the shaft 253 is large, the pivotal movement of the hook main body 252 may be blocked. The large sliding resistance may cause abrasion of the hook main body 252 and/or the shaft 253 and/or fixation of the hook main body 252 to the shaft 253. It is thought that, especially, when materials of the hook main body 252 and the shaft 253 are identical, phenomenon referred to as seizure or galling between components occurs, thus easily increasing the sliding resistance. Therefore, the hook portion 250 may further include a sleeve 400 for the shaft 253. FIG. 4 is a cross-sectional side view illustrating a part of the hook portion 250 (the hook main body 252, the shaft 253, the lever 254, and the sleeve 400). The sleeve 400 has a material that is at least different from the material of the hook main body 252 and the material of the shaft 253. The material of the sleeve 400 may be, for example, polyether ether ketone (PEEK) resin. The sleeve 400 is interposed between the hook main body 252 and the shaft 253 to ensure a smooth pivotal movement of the hook main body 252.

<Mechanical Stop Function>

Figure 5:
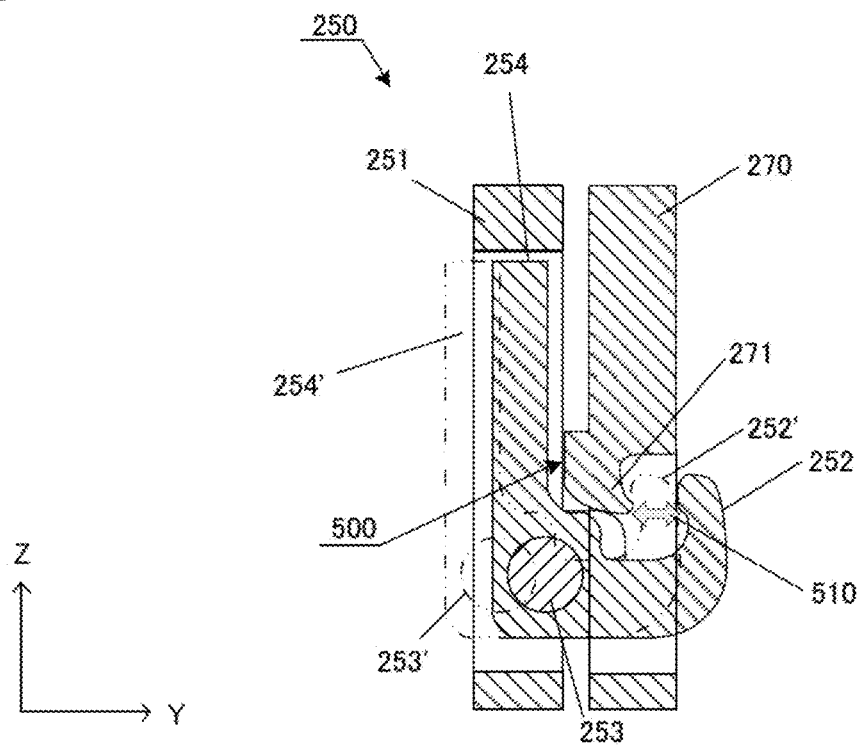
FIG. 5 is a cross-sectional side view illustrating the hook portion and a plate.

The following describes a mechanical stop function of the hook portion 250 and the plate 270 using FIG. 5. FIG. 5 is a cross-sectional side view illustrating the hook portion 250 and the plate 270. FIG. 5 further illustrates positions of the hook main body 252, the shaft 253, and the lever 254 when the hook main body 252 is hooked on the claw 271 (a position 252', a position 253', and a position 254' respectively) with imaginary lines.

When the hook main body 252 is attempted to be hooked on the claw 271, the hook main body 252 need to be positioned on the back side (the right direction in FIG. 5) with respect to the claw 271. This is because, if the hook main body 252 is pivotally moved when the hook main body 252 is positioned on the front side with respect to the position 252', the hook main body 252 collides with the claw 271. Accordingly, when the hook main body 252 is attempted to be hooked on the claw 271, the frame body 240*a* needs to be pushed toward the frame body 240*b* or the frame body 240*b* needs to be pushed toward the frame body 240*a*. The pushing direction is merely relative. Thus, in the following, it is representatively expressed as "the frame body 240*a* is pushed toward the frame body 240*b*." Here, when the hook main body 252 is at the position 252', a seal pressure has been already applied to the outer seal 300 and the inner seal 310. Accordingly, when the frame body 240*a* is pushed toward the frame body 240*b*, it is necessary to resist a reactive force from the outer seal 300, the inner seal 310, and the like.

Also when the hook main body 252 is removed from the claw 271, the frame body 240*a* is preferably pushed toward the frame body 240*b*. This is because the hook main body 252 and the claw 271 cancel the reactive force received from the outer seal 300, the inner seal 310, and the like.

When the frame body 240*a* is pushed toward the frame body 240*b*, the front frame 200*a* approaches the rear frame 200*b*. When the front frame 200*a* approaches the rear frame 200*b* more than expected, a pressure more than expected will be applied to the members of the substrate holder 1 and the substrate W. The pressure more than expected applied to the respective members and the substrate may cause a breakdown of the respective components and the substrate.

To prevent the breakdown of the respective components when the frame body 240*a* is pushed toward the frame body 240*b*, the hook portion 250 and the plate 270 have the mechanical stop function. Specifically, the substrate holder 1 is configured such that the hook base 251 collides with the plate 270 when the frame body 240*a* is excessively pushed toward the frame body 240*b*. In the example in FIG. 5, the hook base 251 collides with the plate 270 in a collision region 500. The collision region 500 may be a region other than the region illustrated in FIG. 5. Configuring the hook portion 250 and the plate 270 such that the hook base 251 collides with the plate 270 defines a maximum pushing length 510, thus allowing the frame body 240*a* not to be pushed more than necessary. The maximum pushing length 510 may be, for example, 0.2 mm, may be, for example, 0.5 mm, may be, for example, 1.0 mm, or may be, for example, 3.0 mm (the maximum pushing length 510 in FIG. 5 is exaggeratedly illustrated).

<Semi-Lock Mechanism>

When the hook portion 250 illustrated in FIGS. 2A to 2C and the plate 270 illustrated in FIGS. 2A to 2C are used, the front frame 200*a* and the rear frame 200*b* take two states: (1) a state that can hold the substrate W, that is, a state where the hook main body 252 is hooked on the claw 271 (hereinafter referred to as "a state where the clamper 290 is locked") and (2) a state where the hook main body 252 is not hooked on the claw 271 (hereinafter referred to as "a state where the clamper 290 is unlocked").

When the clamper 290 is locked, the frame body 240*a* needs to be pushed against the reactive force generated from the outer seal 300 and the like. A strong force is needed to push the frame body 240*a*. Thus, pushing the frame body 240*a* may be a large labor. When the clamper 290 is locked in a condition where the substrate W is not held, for example, the substrate electrodes 320 illustrated in FIG. 3 may directly contact one another and/or the inner seals 310 illustrated in FIG. 3 may directly contact one another. For example, when the substrate electrodes 320 directly contact one another and/or the inner seals 310 directly contact one another, the function of the respective parts may be inhibited and/or performance and durability of the respective parts may be reduced. Accordingly, usually, when the substrate W need not to be held, the clamper 290 is preferably not locked. Furthermore, to clean the substrate electrode 320 and the inner seal 310 and/or the outer seal 300, the front frame 200a and the rear frame 200b are preferably held in a state where a part that should be cleaned (for example, the substrate electrode 320) is exposed. Accordingly, the front frame 200a and the rear frame 200b are preferably held separately. Meanwhile, when all the clampers 290 of the substrate holder 1 that do not hold the substrate W are unlocked, the front frame 200a will be separated from the rear frame 200b (however, it is assumed that there is no securing means other than the clamper 290). When the front frame 200a is separated from the rear frame 200b, a need that both are independently moved and independently stored may arise. When the front frame 200a is separated from the rear frame 200b, a need that the front frame 200a and the rear frame 200b are combined before the substrate holder 1 holds the substrate W arises.

From the above-described aspect, the clamper 290 is preferably configured to take a "semi-lock state." The "semi-lock state" in this description means a "state where the clamper 290 is not locked but the frames are not separated from one another." Making the clamper 290 be in the semi-lock state when the substrate holder 1 does not hold the substrate W can reduce the labor pushing the frame body 240a and facilitate conveyance of the substrate holder 1 with a high throughput.

The clamper 290 (the hook portion 250 and the plate 270) configured to take the semi-lock state will be described using FIGS. 6A to 6C and FIGS. 7A to 7C. In the following, the hook portion 250, the plate 270, and the clamper 290 that are configured to take the semi-lock state are distinguished by attaching "SL" ("S"emi-"L"ock) to the end of the reference numerals (for example, a "clamper 290SL"). However, unless otherwise mentioned, the reference numeral to which "SL" is not attached means both of the member configured to take the semi-lock state and the member configured not to take the semi-lock state (for example, "the plate 270" means both of the plate 270 in FIGS. 2A to 2C and the plate 270SL in FIGS. 7A to 7C).

Figure 6A:
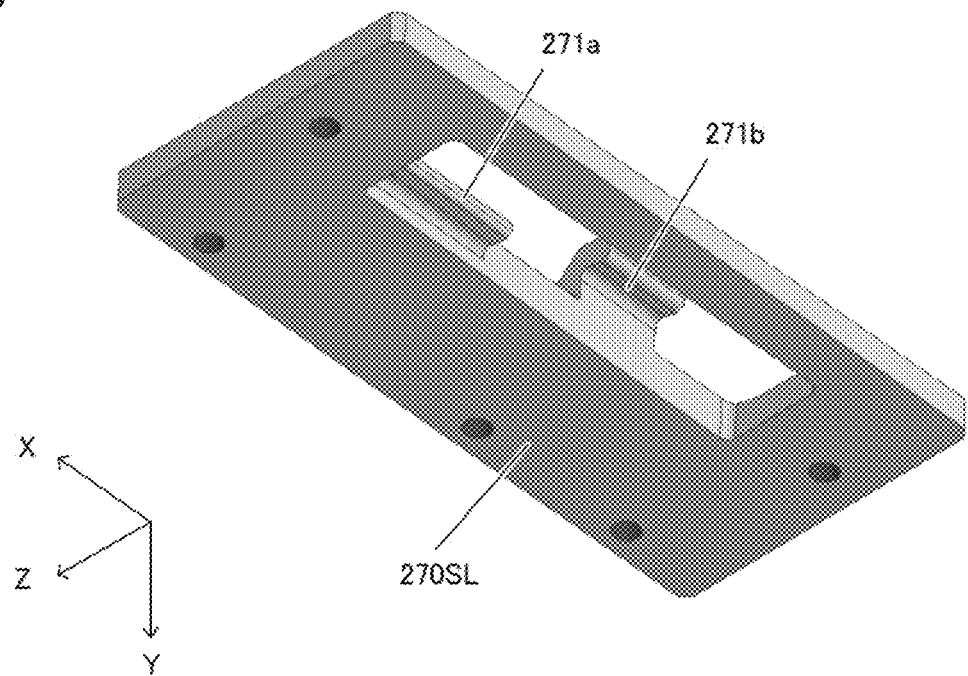
FIG. 6A is a perspective view of the plate viewed from an angle different from those in FIG. 6B and FIG. 6C.
Figure 6B:
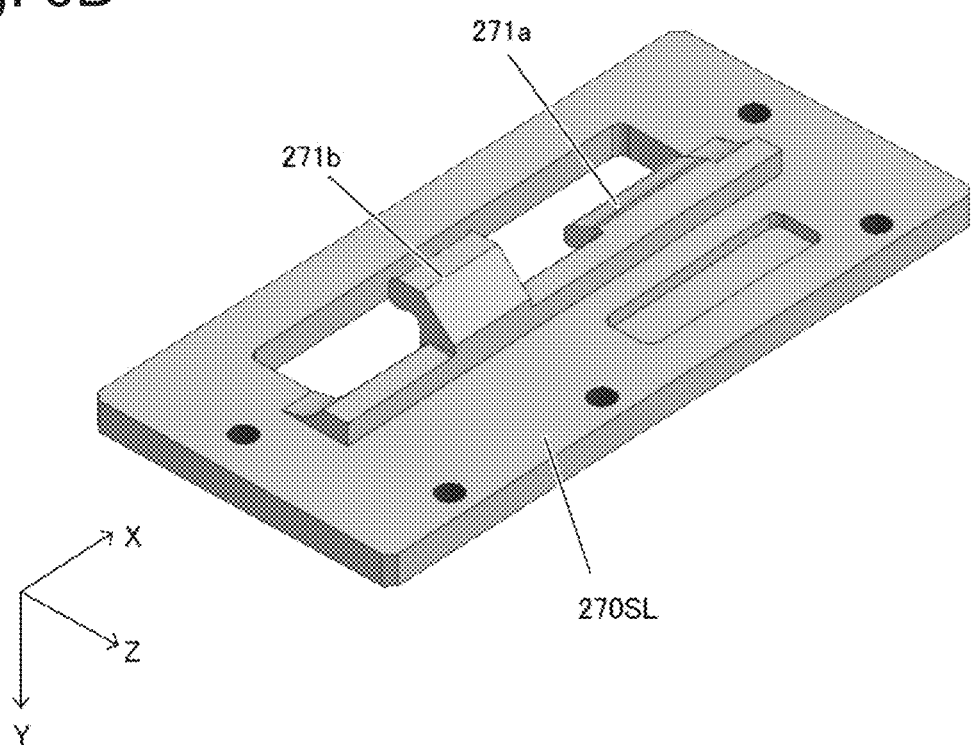
FIG. 6B is a perspective view of the plate viewed from an angle different from those in FIG. 6A and FIG. 6C.
Figure 6C:
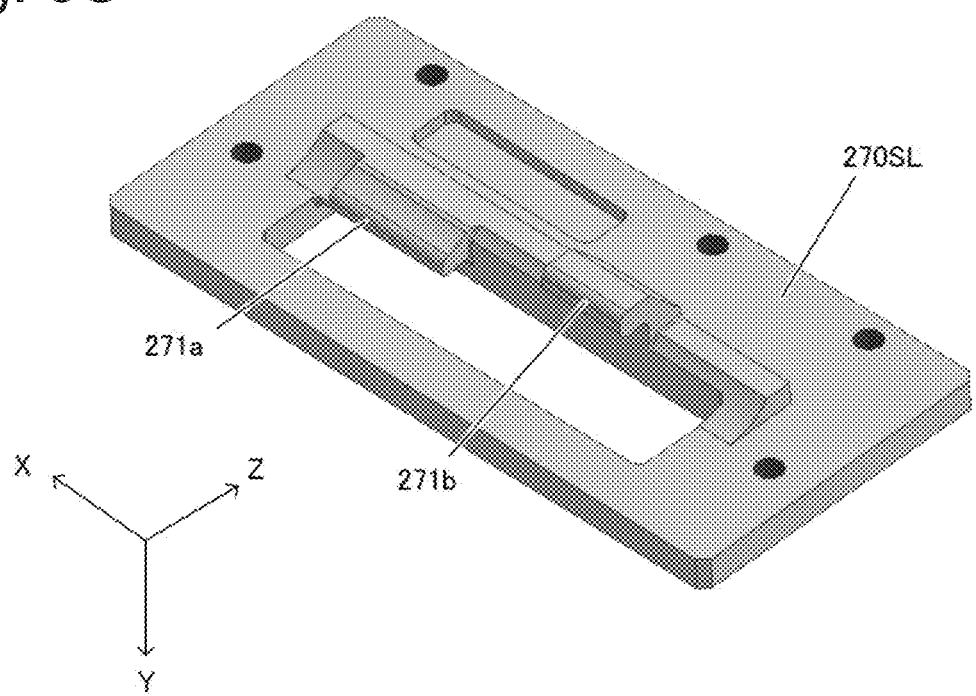
FIG. 6C is a perspective view of the plate viewed from an angle different from those in FIG. 6A and FIG. 6B.
Figure 7A:
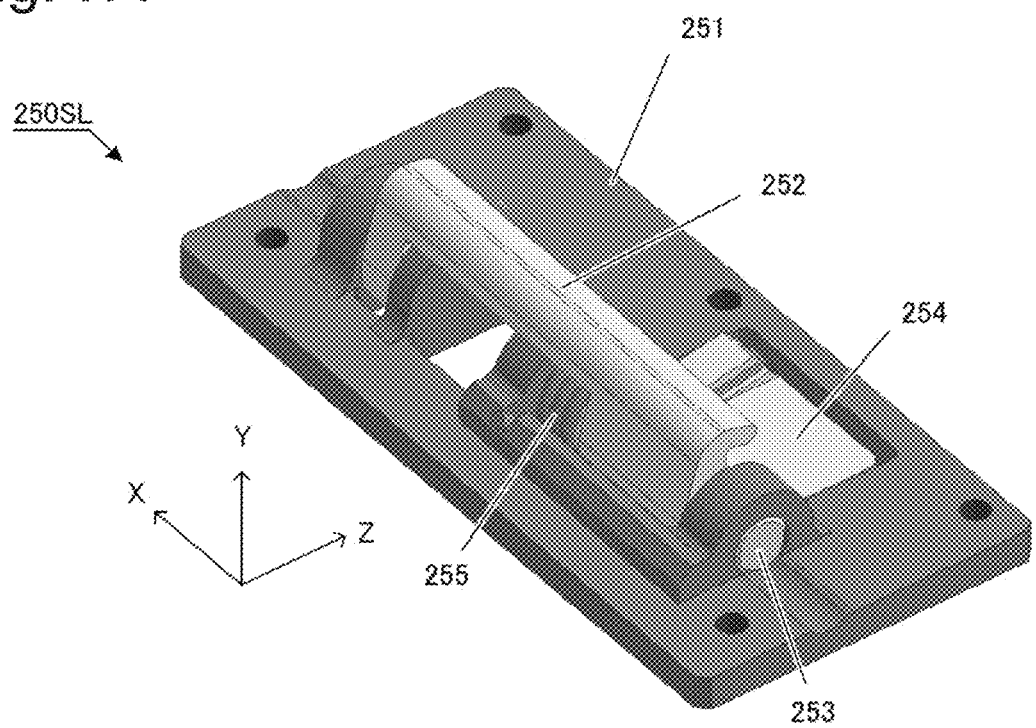
FIG. 7A is a perspective view of the hook portion.
Figure 7B:
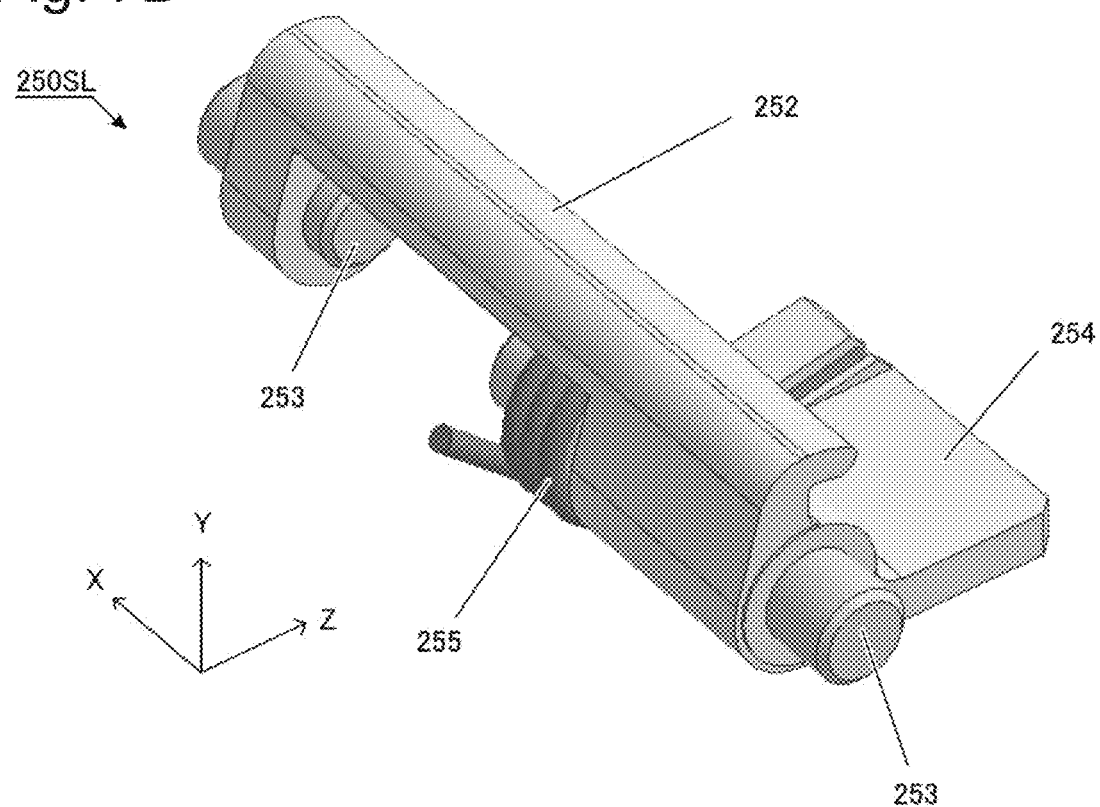
FIG. 7B is a view where a hook base has been removed from FIG. 7A.
Figure 7C:
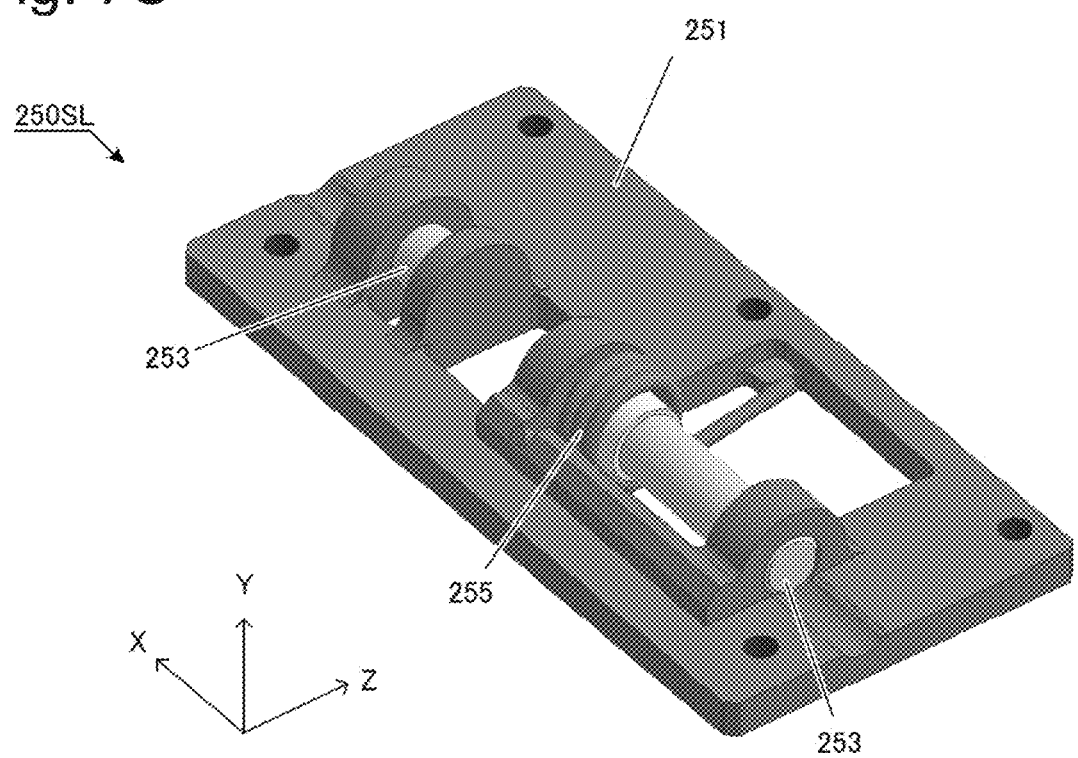
FIG. 7C is a view where a hook main body and a lever have been removed from FIG. 7A.

FIG. 6A, FIG. 6B, and FIG. 6C are perspective views of the plate 270SL viewed from respective different angles. FIG. 7A is a perspective view of the hook portion 250SL. FIG. 7B is a view where the hook base 251 has been removed from FIG. 7A. FIG. 7C is a view where the hook main body 252 and the lever 254 have been removed from FIG. 7A. Note that the elastic supporting member 280 is not illustrated in FIGS. 6A to 6C and FIGS. 7A to 7C.

The plate 270SL includes two claws 271. Specifically, the plate 270SL includes a lock claw 271a and a semi-lock claw 271b. The lock claw 271a may be referred to as a "first claw 271a," and the semi-lock claw 271b may be referred to as a "second claw 271b." The lock claw 271a is similar to the claw 271 illustrated in FIGS. 2A to 2C. That is, the lock claw 271a is configured such that the substrate holder 1 can hold the substrate W when the hook main body 252 is hooked on the lock claw 271a. The semi-lock claw 271b is configured such that a distance between the front frame 200a and the rear frame 200b when the hook main body 252 is hooked on the semi-lock claw 271b is larger than a distance between the front frame 200a and the rear frame 200b when the hook main body 252 is hooked on the lock claw 271a. If expressed briefly, a height of the semi-lock claw 271b is higher than a height of the lock claw 271a (however, "height" here does not necessarily match the vertical direction). If expressed clearly at the expense of an accurate expression, the distance between the front frame 200a and the rear frame 200b is larger in the semi-lock state compared with the lock state.

The hook portion 250SL in FIGS. 7A to 7C has a configuration approximately equal to that of the hook portion 250 in FIGS. 2A to 2C. However, the hook portion 250SL in FIGS. 7A to 7C is different from the hook portion 250 in FIGS. 2A to 2C in that the hook portion 250SL includes a hook main body 252 extended in the X direction (the longitudinal direction of the shaft 253). In association with the expansion of the hook main body 252, the hook main body 252 is supported by two shafts 253. The respective shafts 253 are coaxially arranged. Instead of the two shafts 253, one extended shaft 253 also can be used.

The extended hook main body 252 may be selectively hooked on the lock claw 271a and the semi-lock claw 271b in FIGS. 6A to 6C. When the hook main body 252 is hooked on the lock claw 271a, the clamper 290 is locked. When the hook main body 252 is hooked on the semi-lock claw 271b, the distance between the frame body 240a and the frame body 240b is larger than the distance when the clamper 290 is locked. That is, when the hook main body 252 is hooked on the semi-lock claw 271b, the clamper 290 is "semi-locked." In the semi-lock state, the outer seal 300 and the inner seal 310 are completely not compressed, in a state slightly compressed, or in a state separated from one another. Accordingly, the reactive force generated from the outer seal 300 and the inner seal 310 is negligibly small or zero. Accordingly, the frame body 240a need not be strongly pushed in a transition from the unlock state to the semi-lock state. At the same time, since the hook main body 252 is hooked on the semi-lock claw 271b, the front frame 200a does not separate from the rear frame 200b.

In the plate 270SL in FIGS. 6A to 6C, the lock claw 271a and the semi-lock claw 271b are formed at positions different in the X direction (a direction parallel to a pivot axis of the hook main body 252, that is, the longitudinal direction of the shaft 253). Forming the lock claw 271a and the semi-lock claw 271b by shifting their X positions facilitates production of the plate 270. Forming the lock claw 271a and the semi-lock claw 271b by shifting their X positions easily lowers a height (a length along the Y direction) of the plate 270SL. Lowering the height of the plate 270SL may contribute to the thinning of the holder thickness. However, the lock claw 271a and the semi-lock claw 271b need not to be formed by shifting their X positions. For example, the semi-lock claw 271b may be formed at the X position identical to that of the lock claw 271a. In this case, the semi-lock claw 271b may be extended from a part of the lock claw 271a. The hook main body 252 need not to be extended. For example, when the semi-lock claw 271b is formed at the X position identical to that of the lock claw 271a, a hook portion 250 exactly identical to that illustrated in FIGS. 2A to 2C may be employed as the hook portion 250SL.

FIGS. 7A to 7C illustrate the extended hook main body 252. The extended hook main body 252 has a shape (especially, a cross-sectional shape) that may be different depending on the position. For example, a shape of a part hooked on the lock claw 271a in the extended hook main body 252 may be different from a shape of the other part. Instead of the single extended hook main body 252 illustrated in FIGS. 7A to 7C, a hook portion 250SL including a plurality of separately independent hook main bodies 252 may be used.

Figure 12:
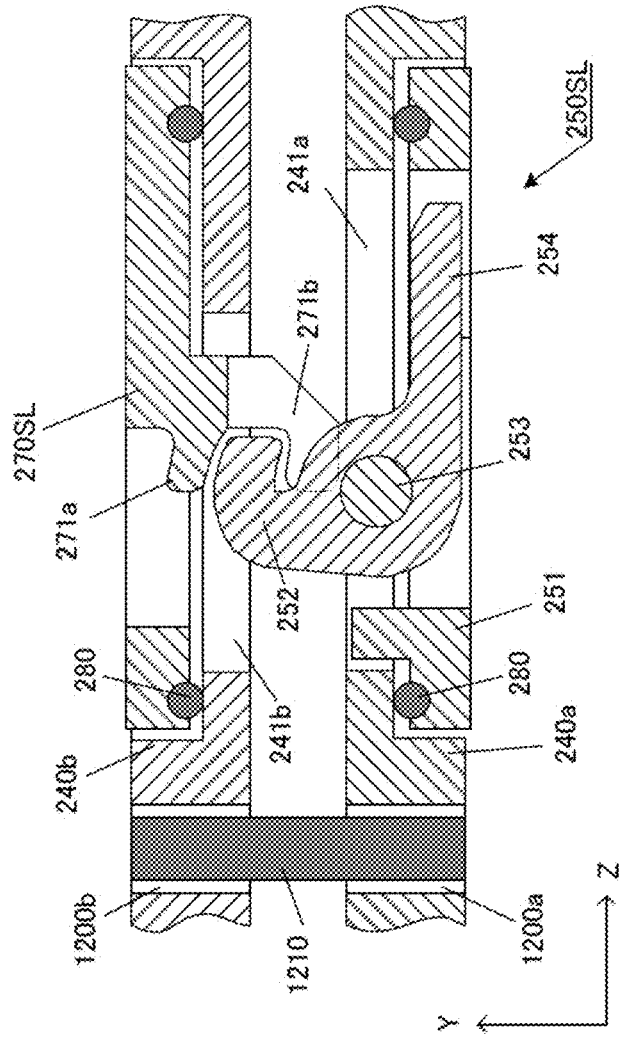
FIG. 12 is a partial cross-sectional view of a substrate holder 1 including a hook portion 250SL and a plate 270SL.

FIG. 12 is a partial cross-sectional view of a substrate holder 1 including the plate 270SL in FIGS. 6A to 6C and the hook portion 250SL in FIGS. 7A to 7C as the clamper 290. However, for convenience of illustration, the shapes of the plate 270SL and the hook portion 250SL illustrated in FIGS. 6A to 6C and FIGS. 7A to 7C are not completely identical to their shapes illustrated in FIG. 12.

In FIG. 12, the clamper 290 is semi-locked. That is, in FIG. 12, the hook main body 252 is hooked on the semi-lock claw 271b. As illustrated in FIG. 12, a certain amount of gap may be provided between the hook main body 252 and the semi-lock claw 271b. The hook main body 252 and thus the frame body 240a may be configured to freely move in a range of the gap between the hook main body 252 and the semi-lock claw 271b. In this description, even in a state where the gap exists between the hook main body 252 and the semi-lock claw 271b as in FIG. 12, the hook main body 252 is considered to be hooked on the semi-lock claw 271b. The existence of the gap prompts the hook main body 252 to be hooked on the semi-lock claw 271b. FIG. 12 exaggeratedly illustrates the gap between the hook main body 252 and the semi-lock claw 271b. As a result of the exaggeration, the hook main body 252 does not contact the semi-lock claw 271b in FIG. 12. However, a part of the hook main body 252 may contact a part of the semi-lock claw 271b in an actual apparatus.

In the case where the clamper 290 is semi-locked, when the frame body 240a moves away from the frame body 240b, the hook main body 252 collides with the semi-lock claw 271b. Accordingly, a movement that the frame body 240a moves away from the frame body 240b (or a movement that the frame body 240b moves away from the frame body 240a) during the semi-lock is restricted by the semi-lock claw 271b. Meanwhile, in the case where the clamper 290 is semi-locked, when the frame body 240a approaches toward the frame body 240b, the hook main body 252 collides with the lock claw 271a. Accordingly, a movement that the frame body 240a approaches the frame body 240b (or a movement that the frame body 240b approaches the frame body 240a) during the semi-lock is restricted by the lock claw 271a. Alternatively, configuring the substrate holder 1 such that the hook main body 252 collides with a component other than the lock claw 271a may restrict the movement that the frame body 240a approaches the frame body 240b.

As aforementioned, in the semi-lock state, at least one, preferably all of the inner seal 310, the outer seal 300, and the substrate electrode 320 are preferably in an exposed state (a state where the members do not directly contact one another). Accordingly, the semi-lock claw 271b is preferably configured such that the distance between the frame body 240a and the frame body 240b in the semi-lock state is a sufficient distance for the exposure of the inner seal 310 and the like.

In the semi-lock state, the frame body 240a and the frame body 240b may rattle. Occurrence of the rattling may adversely affect the conveyance of the substrate holder 1 and the mounting and removal of the substrate W. Therefore, the substrate holder 1 may further include a pin 1210 to reduce the rattling of the frame body 240a and the frame body 240b in the semi-lock state. The frame body 240a and the frame body 240b may include a pin receiver 1200a and a pin receiver 1200b respectively for the pin 1210. The pin 1210 is extending in a direction perpendicular to the substrate W (the Y-axis direction). Accordingly, the pin 1210 is configured to reduce the rattling in a direction parallel to the substrate W (the X-axis direction and the Z-axis direction) of the frame body 240a and the frame body 240b.

The pin receiver 1200a and the pin receiver 1200b in FIG. 12 are through-holes. Inner diameters of the pin receiver 1200a and the pin receiver 1200b in FIG. 12 are illustrated considerably larger than an outer diameter of the pin 1210, but this is merely for convenience of illustration. These inner diameters or outer diameter may be selected depending on an allowable amount of the rattling. These inner diameters or outer diameter may be selected as being appropriate to a clearance fit, may be selected as being appropriate to an interference fit, or may be selected as being appropriate to a transition fit. However, the pin 1210 preferably has a configuration removed freely to some extent so that a transition from the semi-lock state to another state is facilitated. Instead of the pin receiver 1200a and the pin receiver 1200b as the through-holes, pin receivers as blind holes may be used. The pin 1210 in FIG. 12 is a component separately independent from the frame body 240a and the frame body 240b. Instead of it, a pin 1210 integrated with the frame body 240a or the frame body 240b may be used. In this case, any one of the pin receiver 1200a and the pin receiver 1200b will be not necessary. Any pin and pin receiver in any type may be used.

The clamper 290 of the substrate holder 1 stored in the stocker 30 is preferably in the semi-lock state. The substrate holder 1 stored in the semi-lock state is conveyed to a substrate removal/mounting mechanism (not illustrated). The substrate removal/mounting mechanism is configured to select the state (the lock state, the semi-lock state, and the unlock state) of the clamper 290. The substrate removal/mounting mechanism arranges the substrate W at an appropriate position to lock the clamper 290, thus allowing the substrate to be held onto the substrate holder 1. The substrate removal/mounting mechanism releases the lock of the clamper 290, thus also allowing the holding of the substrate W by the substrate holder 1 to be released. The state of the clamper 290 is determined by a positional relationship between the frame body 240a and the frame body 240b (how much the frame body 240a is pushed toward the frame body 240b) when the pivotal movement of the hook main body 252 by the lever 254 is released.

Figure 8:
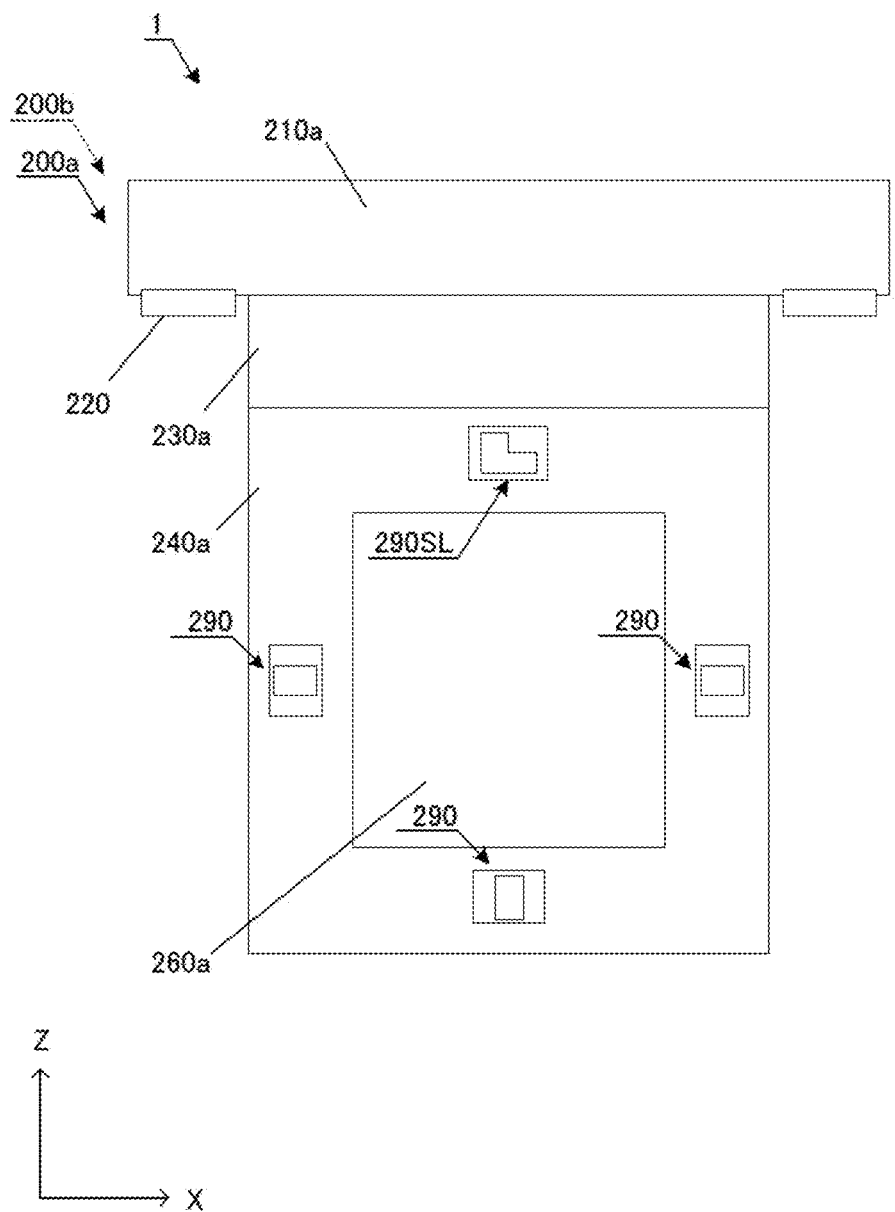
FIG. 8 is a front view of a substrate holder including three clampers and one clamper having a semi-lock function.

FIG. 8 is a front view of a substrate holder 1 including three clampers 290 and one clamper 290SL. As illustrated in FIG. 8, when the substrate holder 1 includes a plurality of clampers 290, at least one of the clampers 290 may be configured to take the semi-lock state. Increasing the number of clampers configured to take the semi-lock state can enhance a stability of the semi-lock state. The number of clampers 290SL may be, for example, three or more.

<Homogenization of Seal Squeeze>

The outer seal 300 and the inner seal 310 have squeezes that may vary according to various conditions. For example, when the opening 260a is square, rigidity of the front frame 200a and the rear frame 200b may vary according to the position. For example, the rigidity near the corner portions of the opening 260a may be higher than the rigidity near the centers of the respective sides of the opening 260a. A deflection amount of the frame when the clamper 290 is locked may vary according to an increase or decrease of the rigidity of the frame. Especially, when a thin front frame 200a and a thin rear frame 200b are used to thin the holder thickness, the rigidity of the frame may be low. The low rigidity of the frame may increase the deflection amount of the frame. When the front frame 200a and the rear frame 200b are deflected, the distance between the front frame 200a and the rear frame 200b may vary according to the position. When the distance between the front frame 200a and the rear frame 200b varies, the seal pressure may also vary. For example, the seal pressure in the proximity of the corner portions of the opening 260a may be higher than the seal pressure at the other position.

On the other hand, the seal squeeze may vary according to a distance from the clamper 290. For example, in the configuration illustrated in FIGS. 2A to 2C, the total four clampers 290 are arranged one by one in the proximities of the centers of the respective sides of the square opening 260a. However, in the configuration in FIGS. 2A to 2C, the distance to the clamper 290 is significantly different depending on the position. Accordingly, when all the four clampers 290 in FIGS. 2A to 2C are locked, the seal pressure may be inhomogeneous. That is, in the configuration in FIGS. 2A to 2C, the seal pressure at a part far from the clamper 290, that is, in the proximity of the corner portions of the opening 260a may be lower than the seal pressure at the other position.

Figure 9:
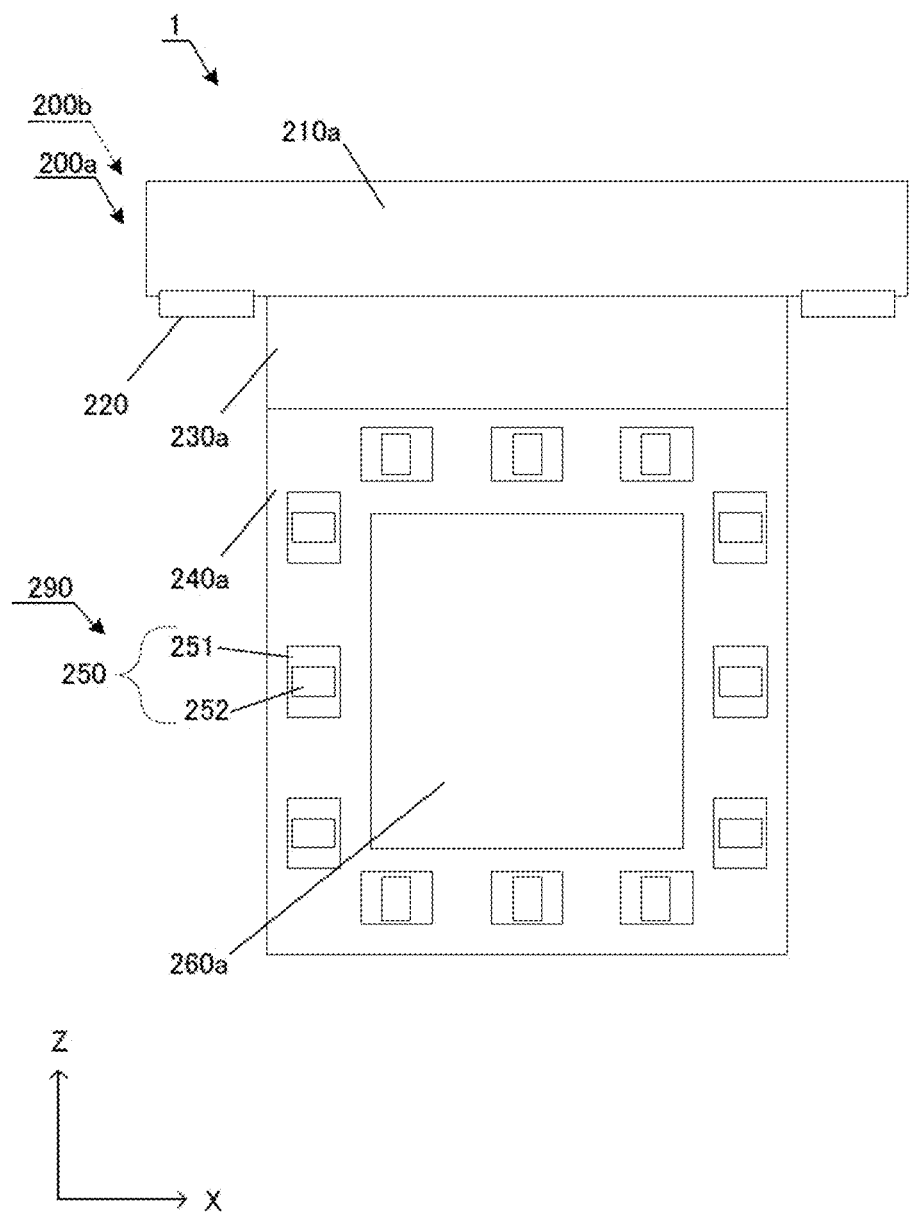
FIG. 9 is a front view of a substrate holder including a plurality of clampers arrayed along respective sides of an angular opening.

To homogenize the squeezes of the outer seal 300 and the inner seal 310 (also referred to as "homogenize the seal pressure"), a plurality of clampers 290 are preferably arranged along the respective sides of the opening 260a. FIG. 9 is a front view of a substrate holder 1 including the clampers 290 such that three clampers 290 are arranged along one side of the opening 260a. The total number of clampers 290 in FIG. 9 is 3 (pieces/side)×4 (sides)=12 (pieces). Any number of clampers 290 among the 12 pieces of clampers 290 may be the clampers 290SL.

Configuring the substrate holder 1 as in FIG. 9 may make the seal pressure in the proximity of the corner portions of the opening 260a higher than the seal pressure at the other position. This is because, in the example in FIG. 9, the clampers 290 slightly concentrate in the proximity of the corner portions of the opening 260a and the rigidity near the corner portions of the opening 260a may be higher compare with the other position as aforementioned. Therefore, properties (for example, the shapes of the hook main body 252 and the claw 271) of the clampers 290 positioned in the proximity of the centers of the respective sides may be adjusted so that the clampers 290 positioned in the proximity of the centers of the respective sides cause high compression of the outer seal 300 and the inner seal 310 (increase the squeeze of the seal).

Adjusting the properties of the respective clampers 290 can further homogenize the squeezes of the outer seal 300 and the inner seal 310. Distribution of the seal pressure may determine how the property of the clamper 290 is adjusted and which clamper 290 is adjusted. The distribution of the seal pressure may vary according to various factors such as the shapes of the opening 260a and the opening 260b, the number, the positions, and the properties of the clampers 290, and the materials, the shapes, and the properties of the outer seal 300 and the inner seal 310.

<Elastic Supporting Member 280>

Figure 10:
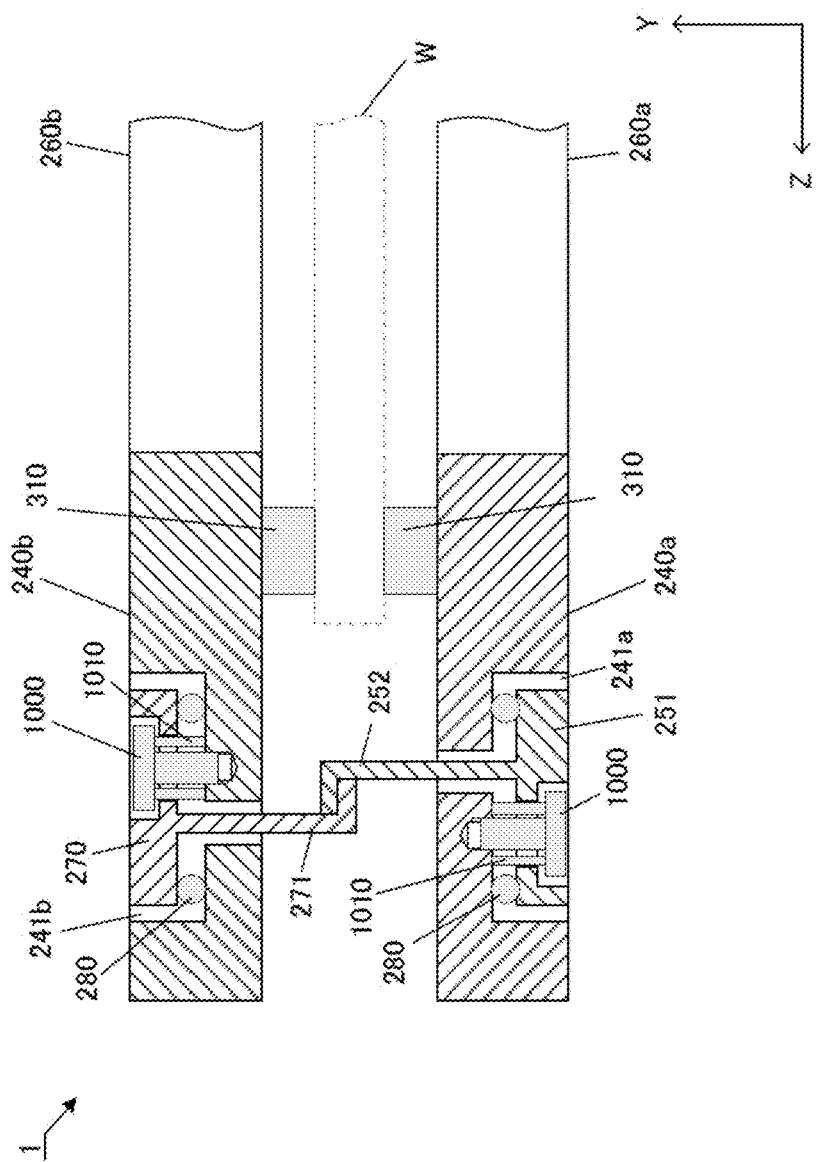
FIG. 10 is a schematically cross-sectional view of a substrate holder.

A description will be given of a role of the elastic supporting member 280 using FIG. 10. FIG. 10 is a schematically cross-sectional view of the substrate holder 1. However, FIG. 10 simplistically illustrates the respective components. Further, some components (for example, the outer seal 300) are not illustrated in FIG. 10. The clamper 290 in FIG. 10 is in the lock state.

The thickness of the substrate W that should be held by the substrate holder 1 is wide-ranging. For example, the thickness of the substrate W may be a value equal to or more than 0.1 mm and equal to or less than 3 mm depending on its type. However, "the thickness of the substrate W" means the thickness of the substrate W at a part interposed by the inner seals 310. Further, when a still another component is interposed between the inner seal 310 and the substrate W, it is assumed that the thickness of this other component is also included in "the thickness of the substrate W." The substrate holder 1 is configured to hold the substrate W whose thickness is different such that the elastic member of the substrate holder 1 deforms.

If the elastic supporting member 280 (and a collar 1010, which is described later) did not exist, the deformation of the inner seal 310 would compensate the variation in the thickness of the substrate W. Accordingly, to be able to hold the substrate having various thicknesses when the elastic supporting member 280 does not exist, the sealing performance of the inner seal 310 has to be kept and a deformable amount of the inner seal 310 has to be large. To increase the deformable amount of the inner seal 310, the material of the inner seal 310 need to be a soft material. Use of the soft inner seal 310 may cause shortage of the seal pressure between the inner seal 310 and the substrate W especially when the thickness of the substrate W is thin. Accordingly, when only the deformation of the inner seal 310 attempts to compensate the variation in the thickness of the substrate W, a range of the compensable thickness of the substrate W may be narrow.

Therefore, the substrate holder 1 in FIG. 10 includes the elastic supporting member 280. Specifically, in FIG. 10, two elastic supporting members 280 are disposed between the hook base 251 and the frame body 240a and between the plate 270 and the frame body 240b. In the example in FIG. 10, the elastic supporting member 280 is an O-ring. The elastic supporting member 280 is not a member for sealing the gap. Thus, an elastic body other than the O-ring, for example, a spring can be employed as the elastic supporting member 280. However, it is not excluded that the elastic supporting member 280 has the function to seal the gap together. The respective elastic supporting members 280 elastically fix the frame body 240a and the hook base 251, and the frame body 240b and the plate 270. The elastic supporting member 280 is a member disposed to compensate the deformation of the inner seal 310 when the thickness of the substrate W varies. Accordingly, the elastic supporting member 280 is deformable in at least the thickness direction of the substrate W (the direction perpendicular to the surface of the substrate W). In other words, the elastic supporting member 280 is deformable in at least a direction where the inner seal 310 is deformable.

The respective hook base 251 and plate 270 are fixed to the frame body 240a or the frame body 240b in a state interposing the elastic supporting member 280 with a fixture 1000 (for example, a bolt). The fixture 1000 has a distal end fastened to the frame body 240a or the frame body 240b, while the frame body 240a is allowed to move in the negative direction of Y with respect to the hook base 251 and the frame body 240b is allowed to move in the positive direction of Y with respect to the plate 270. Accordingly, a term "fix" here is not limited to "closely fix." Preferably, the term "fix" here means "fix the hook portion 250 and the plate 270 to the extent that the hook portion 250 and the plate 270 cannot come off the port 241a and the port 241b."

When the elastic supporting member 280 is disposed, the deformation of the inner seal 310 and the deformation of the elastic supporting member 280 will compensate the variation in the thickness of the substrate W. Compared with a case where the elastic supporting member 280 is not disposed, especially when a thick substrate is held, a deformation amount of the inner seal 310 is small. Accordingly, disposing the elastic supporting member 280 may allow the range of the compensable thickness of the substrate W to increase. "Increase the range of the compensable thickness of the substrate W" can be rephrased as "increase a range of a usable thickness of the substrate W" or "increase a range of a correspondable thickness of the substrate W." The elastic supporting member 280 has an effect to reduce variation in the squeezes of the outer seal 300 and the inner seal 310 generated by a difference in the rigidity depending on the positions of the front frame 200*a* and the rear frame 200*b* together. That is, the elastic supporting member 280 allows the seal pressure to be homogenized.

In the example in FIG. 10, two elastic supporting members 280 are disposed between the hook base 251 and the frame body 240*a* and between the plate 270 and the frame body 240*b*. Disposing the elastic supporting members 280 on both of the front side and the back side of the substrate W can maximally provide an elastically supporting effect. This is because, when the elastic supporting members 280 are disposed on both of the front side and the back side, compared with a case where the elastic supporting member 280 is disposed on only any one of the front side and the back side, the total deformation amount of the elastic supporting member 280 doubles. However, the elastic supporting member 280 may be disposed on only any one of between the hook base 251 and the frame body 240*a* and between the plate 270 and the frame body 240*b*.

When the substrate holder 1 holds the substrate W, the lock claw 271*a* and the hook main body 252 are engaged with one another. Thus, the distance between the hook base 251 and the plate 270 is unchanged (however, variation in distance due to deflection in the component, thermal expansion, a minute vibration, and the like is allowed). On the other hand, the positions of the frame body 240*a* and the frame body 240*b* will be positions where the reactive forces received from the inner seal 310 and the elastic supporting member 280 balance (each frame may also receive the reactive force from the outer seal 300 depending on the configuration of the substrate holder 1, but it is omitted for ease of explanation). FIG. 10 simulatively illustrates a state where the substrate W having a standard thickness is held. When a substrate thicker than the standard thickness is held, the elastic supporting member 280 is also more compressed. Thus, the thicker substrate can be held compared with a case where only the inner seals 310 interpose the substrate without the elastic supporting member 280. When a substrate thinner than the standard thickness is held, the compression of the elastic supporting member 280 weakens. Thus, the thinner substrate can be held compared with the case where only the inner seals 310 interpose the substrate without the elastic supporting member 280. Furthermore, tightening depths to the frame body 240*a* and the frame body 240*b* of the fixtures 1000 are preferably managed in design. This is because it is not preferable that the thickness range of a holdable substrate varies such that the fixture 1000 unexpectedly projects with respect to the hook base 251 or the plate 270 or the fixture 1000 (more specifically, a lower surface of a head of the fixture 1000) contacts the hook base 251 or the plate 270 in the Y direction. In other words, when the tightening depths to the frame body 240*a* and the frame body 240*b* of the fixtures 1000 are not managed in design, an elastic condition when the substrate W is held may vary. Therefore, in this embodiment, respective sleeve-shaped collars 1010 are disposed between the heads of the fixtures 1000, and the frame body 240*a* and the frame body 240*b*. This makes the tightening depths to the frame body 240*a* and the frame body 240*b* of the fixtures 1000 constant. The collar 1010 is formed of a material that can be considered as a rigid body. The collar 1010 may be configured to determine a position in an X-Z plane of the hook base 251 with respect to the frame body 240*a* and a position in the X-Z plane of the plate 270 with respect to the frame body 240*b*.

Figure 11:
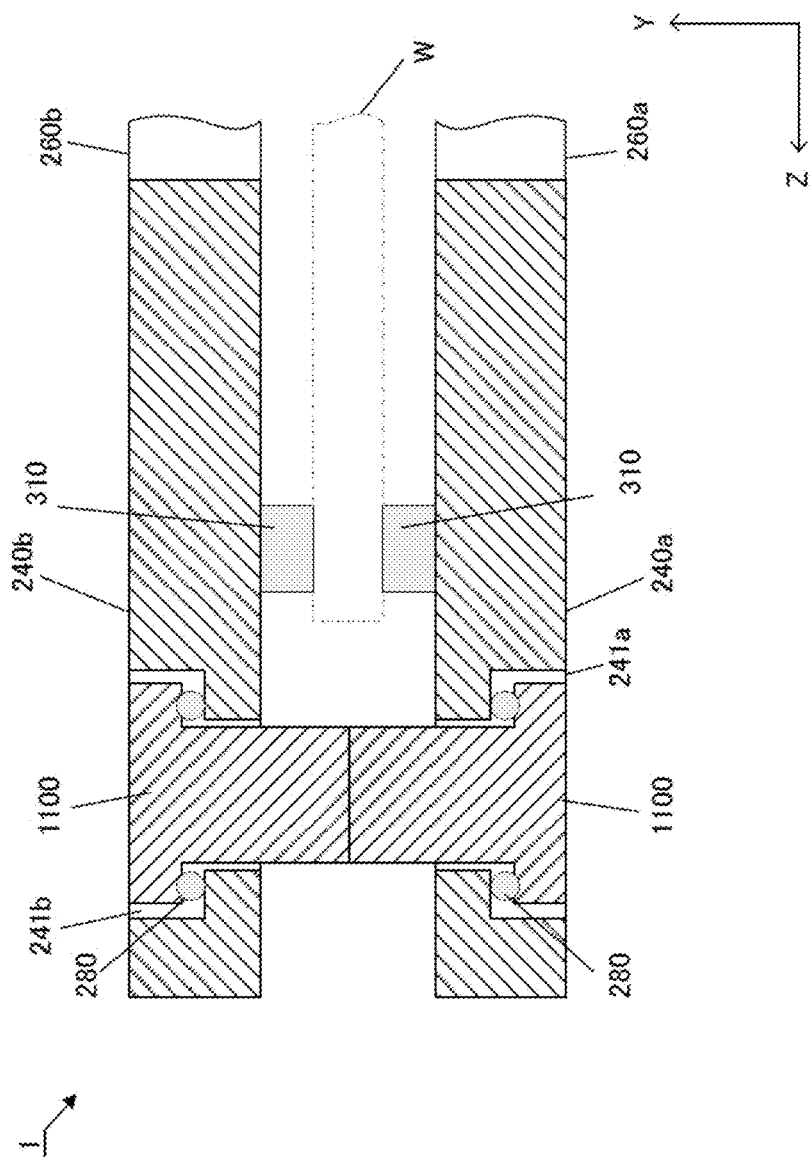
FIG. 11 is a schematically cross-sectional view of a substrate holder including a magnet clamper.

The elastic supporting member 280 can be also disposed on a substrate holder 1 that fixes the frame body 240*a* and the frame body 240*b* with a magnetic force without mechanically hooking the hook. FIG. 11 is a cross-sectional view of the substrate holder 1 including at least a pair of magnet clampers 1100 as the clamper 290. The magnet clampers 1100 are configured to stick to one another with the magnetic force. The respective magnet clampers 1100 are mounted on the port 241*a* and the port 241*b*. The magnet clamper 1100 may be fixed with, for example, the fixture 1000 as illustrated in FIG. 10. Similarly to the case in FIG. 10, the elastic supporting members 280 are disposed between the magnet clamper 1100 and the frame body 240*a* or the frame body 240*b*. Also in the example in FIG. 11, disposing the elastic supporting member 280 may allow the shortage of the seal pressure between the inner seal 310 and the substrate W to reduce and eventually the range of the compensable thickness of the substrate W to increase.

The embodiment described above includes the lock claw 271*a* and the semi-lock claw 271*b* having different heights. However, as another embodiment, a hook main body for the lock and a hook main body for the semi-lock having different heights may be disposed. In this case, the hook main body for the lock and the hook main body for the semi-lock may be one hook portion as turning with one lever. Alternatively, the hook main body for the lock and the hook main body for the semi-lock may be different hook portions to be turned with respective levers.

The embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

This application discloses a substrate holder for holding a substrate by interposing the substrate between frames as one embodiment. The substrate holder includes a front frame, a rear frame, and one or a plurality of clampers that clamp the front frame and the rear frame. One or a plurality of the clampers each include a hook portion and a plate. The hook portion is mounted on one of the front frame and the rear frame. The hook portion includes a hook base and a hook main body. The hook main body is pivotably mounted on the hook base. The plate is mounted on another of the front frame and the rear frame. The plate includes at least one claw configured such that the hook main body is hooked on the claw with a pivotal movement of the hook main body. At least one of one or a plurality of the clampers include the plate including a first claw and a second claw. The first claw is configured to allow the substrate holder to hold a substrate such that the hook main body is hooked on the first claw. The second claw is configured such that a distance between the front frame and the rear frame when the hook main body is hooked on the second claw is larger than a distance between the front frame and the rear frame when the hook main body is hooked on the first claw.

This substrate holder provides an effect that ensures the semi-lock state as one example.

Further, this application discloses a substrate holder where the front frame and/or the rear frame has an opening to expose a substrate as one embodiment.

This disclosure clarifies the detail of the substrate holder.

Further, this application discloses a substrate holder where the hook portion includes a pressing member that applies a force in a direction maintaining hooking on the claw of the hook main body as one example.

This substrate holder provides an effect that can prevent release of the hooking on the claw of the hook main body as one embodiment.

Further, this application discloses a substrate holder where the pressing member is a torsion spring as one embodiment.

This substrate holder provides an effect that can thin the holder thickness as one example.

Further, this application discloses a substrate holder where a position of the second claw along a direction parallel to a pivot axis of the hook main body is different from a position of the first claw along the direction parallel to the pivot axis of the hook main body as one embodiment.

This substrate holder provides an effect that facilitates at least one of producing the plate and decreasing the height of the plate as one example.

Further, this application discloses a substrate holder where the hook portion includes a shaft and a sleeve as one embodiment. The shaft pivotably supports the hook main body with respect to the hook base. The sleeve is disposed between the shaft and the hook main body. The sleeve has a material different from a material of the shaft and a material of the hook main body.

This substrate holder provides an effect that can prevent scoring of the hook portion as one example.

Further, this application discloses a substrate holder where at least one of the hook portion and the plate is mounted on any of the front frame and the rear frame via an elastic supporting member as one embodiment.

This substrate holder provides an effect that can increase the range of the correspondable thickness of the substrate W as one example.

Further, this application discloses a substrate holder where the front frame and/or the rear frame includes a first sealing member that contacts a substrate when the substrate is held as one embodiment.

Further, this application discloses a substrate holder including a second sealing member as one embodiment. The second sealing member is mounted on one of the front frame and the rear frame. The second sealing member is configured to contact another of the front frame and the rear frame.

Further, this application discloses a substrate holder where the hook portion and the plate are mounted on any of the front frame and the rear frame with a fixture as one embodiment.

These disclosures clarify the detail of the substrate holder.

Further, this application discloses a substrate holder configured such that the hook base collides with the plate when the front frame is pushed toward the rear frame as one embodiment.

This substrate holder provides an effect that can prevent the breakdown of the substrate holder and the substrate when the frame is pushed as one example.

Further, this application discloses a substrate holder where the clamper is buried in the front frame and the rear frame as one embodiment.

This substrate holder provides an effect that ensures at least one of thinning the holder thickness and reducing the amount of the plating solution that remains at the substrate holder as one example.

Further, this application discloses a substrate holder for holding a substrate by interposing the substrate between frames as one embodiment. The substrate holder includes a front frame, a rear frame, a first sealing member, and one or a plurality of clampers. The first sealing member is mounted on at least one of the front frame and the rear frame. The first sealing member is configured to contact a substrate. The one or the plurality of clampers clamp the front frame and the rear frame. The clamper is mounted on the front frame or the rear frame via an elastic supporting member.

Further, this application discloses a substrate holder where the first sealing members are mounted on the respective front frame and rear frame as one embodiment.

Further, this application discloses a substrate holder where a part of the clamper is mounted on the front frame via a first elastic supporting member, and another part of the clamper is mounted on the rear frame via a second elastic supporting member as one embodiment.

Further, this application discloses a substrate holder where the elastic supporting member is deformable in a direction where the first sealing member is deformable as one embodiment.

Further, this application discloses a substrate holder including a second sealing member as one embodiment. The second sealing member is mounted on one of the front frame and the rear frame. The second sealing member is configured to contact another of the front frame and the rear frame.

These disclosures clarify the detail of the substrate holder including the clamper mounted via the elastic supporting member.

REFERENCE SIGNS LIST

W . . . substrate
1 . . . substrate holder
25 . . . cassette table
25a . . . cassette
27 . . . substrate conveying device
28 . . . running mechanism
29 . . . substrate removal/mounting mechanism
30 . . . stocker
32 . . . pre-wet tank
33 . . . pre-soak tank
34 . . . pre-rinse tank
35 . . . blow tank
36 . . . rinse tank
37 . . . substrate holder conveyance device
38 . . . overflow tank
39 . . . plating tank
50 . . . cleaning device
50a . . . cleaning unit
100 . . . plating device
110 . . . loading/unloading unit
120 . . . processing unit
120A . . . preprocessing/postprocessing unit
120B . . . plating processing unit
175 . . . controller
175A . . . CPU
175B . . . memory
175C . . . control unit
200a . . . front frame
200b . . . rear frame
210a, b . . . arm portion 220 . . . shoulder-part electrode
230a, b . . . wiring storage
240a, b . . . frame body
241a, b . . . port
250 (250SL) . . . hook portion
251 . . . hook base
252 . . . hook main body
253 . . . shaft
252', 253', 254' . . . respective positions of hook main body, shaft, and lever when hook main body is hooked on claw
254 . . . lever
255 . . . pressing member
260a . . . opening
260b . . . opening
270 (270SL) . . . plate
271 . . . claw
271a . . . lock claw (first claw)
271b . . . semi-lock claw (second claw)
280 . . . elastic supporting member
290 (290SL) . . . clamper
300 . . . outer seal (second sealing member)
310 . . . inner seal (first sealing member)
320 . . . substrate electrode
400 . . . sleeve
500 . . . collision region
510 . . . maximum pushing length
1000 . . . fixture
1010 . . . collar
1100 . . . magnet clamper
1200a, b . . . pin receiver
1210 . . . pin

What is claimed is:

1. A substrate holder for holding a substrate by interposing the substrate between frames, the substrate holder comprising:
    a front frame;
    a rear frame; and
    one or a plurality of clampers that clamp the front frame and the rear frame, wherein
    the one or the plurality of the dampers each include:
        a hook portion mounted on one of the front frame and the rear frame, the hook portion including a hook base and a hook main body, the hook portion including a shaft that pivotably supports the hook main body with respect to the hook base, the shaft extending parallel to the surface of the substrate, the hook main body being pivotably mounted on the hook base; and
        a plate mounted on another of the front frame and the rear frame, the plate including a plurality of claws configured such that the hook main body is hooked on the claws with a pivotal movement of the hook main body, the plurality of claws including a first claw and second claw,
    the one or the plurality of the dampers include the plate including the first claw and the second claw,
    the first claw is configured to allow the substrate holder to hold the substrate such that the hook main body is hooked on the first claw, and
    the second claw is configured such that a distance between the front frame and the rear frame when the hook main body is hooked on the second claw is larger than a distance between the front frame and the rear frame when the hook main body is hooked on the first claw,
    a position of the second claw along a direction parallel to a pivot axis of the hook main body is different from a position of the first claw along the direction parallel to the pivot axis of the hook main body.

2. The substrate holder according to claim 1, wherein the front frame and/or the rear frame has an opening to expose a substrate.

3. The substrate holder according to claim 1, wherein the hook portion includes a pressing member that applies a force in a direction maintaining hooking of the hook main body on the claws.

4. The substrate holder according to claim 3, wherein the pressing member is a torsion spring.

5. The substrate holder according to claim 1, wherein the hook portion includes:
    a sleeve disposed between the shaft and the hook main body, the sleeve having a material different from a material of the shaft and a material of the hook main body.

6. The substrate holder according to claim 1, wherein at least one of the hook portion and the plate is mounted on any of the front frame and the rear frame via an elastic supporting member.

7. The substrate holder according to claim 6, wherein the front frame and/or the rear frame includes a first sealing member that contacts a substrate when the substrate is held.

8. The substrate holder according to claim 7, further comprising
    a second sealing member mounted on one of the front frame and the rear frame, the second sealing member being configured to contact another of the front frame and the rear frame.

9. The substrate holder according to claim 6, wherein the hook portion and the plate are mounted on any of the front frame and the rear frame with a fixture.

10. The substrate holder according to claim 1, wherein the substrate holder is configured such that the hook base collides with the plate when the front frame is pushed toward the rear frame.

11. The substrate holder according to claim 1, wherein the one or the plurality of clampers is buried in the front frame and the rear frame.

* * * * *